US012635371B2

(12) United States Patent
Wang et al.

(10) Patent No.: US 12,635,371 B2
(45) Date of Patent: *May 19, 2026

(54) DISPLAY PANEL AND DISPLAY APPARATUS

(71) Applicants: Chengdu BOE Optoelectronics Technology Co., Ltd., Chengdu (CN); BOE TECHNOLOGY GROUP CO., LTD., Beijing (CN)

(72) Inventors: Binyan Wang, Beijing (CN); Yao Huang, Beijing (CN); Cong Liu, Beijing (CN); Yu Wang, Beijing (CN); Benlian Wang, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/009,036

(22) Filed: Jan. 3, 2025

(65) Prior Publication Data

US 2026/0123221 A1     Apr. 30, 2026

(51) Int. Cl.
*H10K 59/131*          (2023.01)
*G09G 3/3233*          (2016.01)
(Continued)

(52) U.S. Cl.
CPC ....... *H10K 59/1315* (2023.02); *G09G 3/3233* (2013.01); *H10K 59/1213* (2023.02);
(Continued)

(58) Field of Classification Search
CPC ......... G09G 3/3233; G09G 2300/0426; G09G 2300/0819; G09G 2300/0842;
(Continued)

(56) References Cited

U.S. PATENT DOCUMENTS

2003/0128173 A1     7/2003   Ko
2011/0164019 A1     7/2011   Son
(Continued)

FOREIGN PATENT DOCUMENTS

CN          107799068 A      3/2018
CN          109377932 A      2/2019
(Continued)

OTHER PUBLICATIONS

Extended European Search Report issued in Application No. 21958851.4 dated Mar. 15, 2024, (10p).
(Continued)

*Primary Examiner* — Nelson M Rosario
(74) *Attorney, Agent, or Firm* — Arch & Lake LLP

(57)          ABSTRACT

A display panel and an display apparatus are provided, the display panel includes at least two adjacent pixel driving circuits including a first and a second pixel driving circuits distributed along the first direction; a first conductive layer between the first active layer and the second conductive layer, the first conductive layer including an enabling signal line with an orthographic projection extending along the first direction and covering an orthographic projection of the fifth active portion, a partial structure of the enabling signal line forming a gate of the fifth transistor; a fourth conductive layer located between a second and a fifth conductive layers and including a first bridging portion which is connected to eighth active portions of the first and second pixel driving circuits, as well as a power line through a via hole, respectively.

20 Claims, 20 Drawing Sheets

(51) Int. Cl.
  *H10K 59/121* (2023.01)
  *H10K 59/126* (2023.01)
(52) U.S. Cl.
  CPC . *H10K 59/1216* (2023.02); *G09G 2300/0426* (2013.01); *G09G 2300/0819* (2013.01); *G09G 2300/0842* (2013.01); *G09G 2310/08* (2013.01); *H10K 59/126* (2023.02)
(58) Field of Classification Search
  CPC ... G09G 2300/0861; G09G 2310/0251; G09G 2310/08; G09G 3/3208; G09G 3/3258; G09G 3/3266; G09G 3/3291; G09G 2300/0408; G09G 2300/0439; G09G 2300/0814; G09G 2300/0852; G09G 2320/0247; G09G 2320/045; G09G 2330/021; G09G 2300/0866; H01L 27/1225; H01L 27/124; H01L 27/1255; H10K 59/1213; H10K 59/1216; H10K 59/1315; H10K 59/126; H10K 59/131; H10K 59/1201; H10K 59/123; H10K 59/88
  See application file for complete search history.

(56) References Cited

U.S. PATENT DOCUMENTS

| | | |
|---|---|---|
| 2015/0243203 A1 | 8/2015 | Kim et al. |
| 2016/0203765 A1 | 7/2016 | Lee |
| 2016/0210896 A1 | 7/2016 | Gil |
| 2016/0372040 A1 | 12/2016 | Huangfu et al. |
| 2019/0044040 A1* | 2/2019 | Andrews ............ H10H 20/8252 |
| 2019/0237010 A1 | 8/2019 | Lin et al. |
| 2020/0152117 A1 | 5/2020 | Lin et al. |
| 2020/0211477 A1 | 7/2020 | Lai et al. |
| 2020/0411619 A1 | 12/2020 | Huang et al. |
| 2021/0125557 A1 | 4/2021 | Na |
| 2021/0376026 A1 | 12/2021 | Mou et al. |
| 2022/0140039 A1 | 5/2022 | Mou et al. |
| 2022/0399417 A1 | 12/2022 | Mou et al. |
| 2023/0292552 A1 | 9/2023 | Mou et al. |

FOREIGN PATENT DOCUMENTS

| | | |
|---|---|---|
| CN | 110289270 A | 9/2019 |
| CN | 111682054 A | 9/2020 |
| CN | 112259595 A | 1/2021 |
| CN | 112885850 A | 6/2021 |
| CN | 113078174 A | 7/2021 |
| CN | 113178140 A | 7/2021 |
| CN | 113196498 A | 7/2021 |
| EP | 4067987 A1 | 10/2022 |
| EP | 4068380 A1 | 10/2022 |
| EP | 4089740 A1 | 11/2022 |
| KR | 20030058152 A | 7/2003 |
| KR | 20110080905 A | 7/2011 |
| WO | 2021104428 A1 | 6/2021 |

OTHER PUBLICATIONS

Written Opinion of the International Searching Authority issued in Application No. PCT/CN2021/122094 dated May 19, 2022 with English Translation, (4p).
JPOA issued in Application No. 2023-550287 dated Jun. 3, 2025 with English translation, (13p).
Hearing Notice issued to Indian Application No. 202327052949 dated Feb. 19, 2026, (3p).

* cited by examiner

DISPLAY PANEL AND DISPLAY APPARATUS

CROSS-REFERENCE

The present application is a Continuation of U.S. application Ser. No. 17/800,847, filed on Aug. 18, 2022, which is based on International Application No. PCT/CN2021/122094, filed on Sep. 30, 2021, the entire content of which is incorporated herein by reference for all purposes.

TECHNICAL FIELD

The present disclosure relates to a field of display technology, and more particularly to a display panel and a display apparatus.

BACKGROUND

In the related art, a display panel provides a power terminal to a pixel driving circuit through a power line. However, due to a voltage drop of the power line itself, there is a voltage difference between the power terminals at different positions of the display panel, resulting in uneven display of the display panel.

It should be noted that, information disclosed in the above background portion is provided only for better understanding of the background of the present disclosure, and thus it may contain information that does not form the prior art known by those ordinary skilled in the art.

SUMMARY

A display panel is provided, which includes a plurality of pixel driving circuits distributed in an array along a first direction and a second direction, where the first direction and the second direction intersect, the pixel driving circuit includes a driving transistor and a capacitor, a first electrode of the capacitor is connected to a gate of the driving transistor, and a second electrode of the capacitor is connected to a power line, and the display panel further includes:

a substrate base;
a second conductive layer located on a side of the substrate base, where the second conductive layer includes:
a plurality of second conductive portions, where the second conductive portion is configured to form the second electrode of the capacitor in the pixel driving circuit corresponding to the second conductive portion;
a fifth conductive layer located on a side of the second conductive layer away from the substrate base, where the fifth conductive layer includes:
a plurality of the power lines, where at least one of the plurality of second conductive portions being electrically connected to at least one of the plurality of the power lines;
where the display panel includes at least two adjacent pixel driving circuits, and the two adjacent pixel driving circuits include a first pixel driving circuit and a second pixel driving circuit distributed along the first direction;
the second conductive layer further include:
a second connection sub-portion connected between two second conductive portions in the first pixel driving circuit and the second pixel driving circuit respectively in the first direction;

where the pixel driving circuit further includes a fifth transistor, where a first electrode of the fifth transistor is connected to the power line, and a second electrode of the fifth transistor is connected to a first electrode of the driving transistor;
the first active layer includes:
a fifth active portion configured to define a channel region of the fifth transistor;
an eighth active portion connected to a side of the fifth active portion away from the third active portion;
the display panel further includes:
a first conductive layer located between the first active layer and the second conductive layer, where the first conductive layer includes:
an enabling signal line, an orthographic projection of the enabling signal line on the substrate base extending along the first direction and covering an orthographic projection of the fifth active portion on the substrate base, and a partial structure of the enabling signal line being configured to form a gate of the fifth transistor;
a fourth conductive layer located between the second conductive layer and the fifth conductive layer, where the fourth conductive layer includes:
a first bridging portion connected to the eighth active portion in the first pixel driving circuit and the eighth active portion in the second pixel driving circuit through a via hole, respectively, and the first bridging portion being connected to the power line through a via hole.

In some embodiments, an orthographic projection of the first bridging portion on the substrate base and the orthographic projection of the enabling signal line on the substrate base have an overlapping region, where a size of the overlapping region along the first direction is less than a size of the first bridging portion along the first direction.

In some embodiments, a hollow portion is defined on the first bridging portion.

In some embodiments, the first bridging portion is connected to the eighth active portion through one via hole.

In some embodiments, the first bridging portion includes a third via-hole contact portion connected to the power line through a via hole and a fourth via-hole contact portion connected to the power line through a via hole; and orthographic projections of the third via-hole contact portion and the fourth via-hole contact portion on the substrate base are at least partially overlapped with and the orthographic projection of the enabling signal line on the substrate base.

In some embodiments, the display panel further includes:
a third conductive layer located on a side of the second conductive layer away from the substrate base, where the third conductive layer includes a first gate line;
where the second conductive layer includes a third gate line; the pixel driving circuit further includes a second transistor;
where a partial structure of the first gate line is configured to form a top gate of the second transistor and a partial structure of the third gate line is configured to form a bottom gate of the second transistor.

In some embodiments, an orthographic projection of the first bridging portion on the substrate base does not overlap with orthographic projections of the first gate line and the third gate line on the substrate base.

In some embodiments, the display panel further includes:
a light shielding layer located between the substrate base and the first active layer, where the light shielding layer includes:

a plurality of light shielding portions being arranged in one-to-one correspondence with the plurality of the pixel driving circuits, and a plurality of longitudinal connection portions extending longitudinally from the plurality of light shielding portions;

where an orthographic projection of the first bridging portion on the substrate base is at least partially overlapped with orthographic projections of the plurality of longitudinal connection portions on the substrate base.

In some embodiments, the display panel further includes:

a first active layer located between the substrate base and the second conductive layer, where the first active layer includes:

a plurality of third active portions arranged in one-to-one correspondence with the plurality of the pixel driving circuits, the third active portion being configured to define a channel region of the driving transistor in the pixel driving circuit corresponding to the third active portion;

a light shielding layer located between the substrate base and the first active layer, where the light shielding layer includes:

a plurality of light shielding portions being arranged in one-to-one correspondence with the plurality of the pixel driving circuits, an orthographic projection of the light shielding portion on the substrate base covering an orthographic projection of the third active portion on the substrate base in the pixel driving circuit corresponding to the light shielding portion.

In some embodiments, the pixel driving circuit further includes a first transistor and a second transistor, a first electrode of the first transistor is connected to the gate of the driving transistor, a second electrode of the first transistor is connected to a first initial signal line, and a first electrode of the second transistor is connected to the gate of the driving transistor, a second electrode of the second transistor is connected to a second electrode of the driving transistor, and the display panel further includes:

a second active layer located between the second conductive layer and the fifth conductive layer, where the second active layer includes:

a first active portion configured to define a channel region of the first transistor;

a second active portion connected to the first active portion and configured to define a channel region of the second transistor;

the power line includes a second extension portion;

an orthographic projection of the second extension portion on the substrate base covering an orthographic projection of the first active portion on the substrate base and an orthographic projection of the second active portion on the substrate base.

In some embodiments, the power line further includes: a first extension portion and a third extension portion, and the second extension portion is connected between the first extension portion and the third extension portion;

a size of the orthographic projection of the second extension portion on the substrate base in the first direction is larger than a size of an orthographic projection of the first extension portion on the substrate base in the first direction, and the size of the orthographic projection of the second extension portion on the substrate base in the first direction is larger than a size of an orthographic projection of the third extension portion on the substrate base in the first direction;

the size of the orthographic projection of the second extension portion on the substrate base in the first direction is $L1$, and the size of the orthographic projection of the second extension portion on the substrate base in the second direction is $L2$, where $L1/L2$ is less than or equal to ½.

In some embodiments, a notch or a hollow structure is defined on the second extension portion, the pixel driving circuit further includes a fourth transistor, a first electrode of the fourth transistor is connected to a data line, a second electrode of the fourth transistor is connected to a first electrode of the driving transistor, and the display panel further includes:

a first active layer located between the substrate base and the second conductive layer, the first active layer including a fourth active portion configured to define a channel region of the fourth transistor;

a first conductive layer located between the first active layer and the second conductive layer, where the first conductive layer includes a second gate line, an orthographic projection of the second gate line on the substrate base covers an orthographic projection of the fourth active portion on the substrate base, and extends along the first direction, a partial structure of the second gate line is configured to form a gate of the fourth transistor;

a third conductive layer located between the second active layer and the fifth conductive layer, where the third conductive layer includes a first reset signal line, an orthographic projection of the first reset signal line on the substrate base covers the orthographic projection of the first active portion on the substrate base, and a partial structure of the first reset signal line is configured to form a gate of the first transistor;

where the notch is defined on a side of the second extension portion facing the fourth active portion, and an orthographic projection of the notch on the substrate base is located between the orthographic projection of the second gate line on the substrate base and the orthographic projection of the first reset signal line on the substrate base.

In some embodiments, an orthographic projection of the hollow portion on the substrate base at least partially overlaps with the orthographic projection of the enabling signal line on the substrate base.

In some embodiments, the second direction is a column direction, and each column of the pixel driving circuit is correspondingly provided with one power line, and the power line in the first pixel driving circuit and the power line in the second pixel driving circuit are connected to the first bridging portion through a via hole, respectively;

the first bridging portion includes:

a first via-hole contact portion;

a second via-hole contact portion arranged opposite to the first via-hole contact portion in the second direction, and connected to the eighth active portion in the first pixel driving circuit through a via hole;

a third via-hole contact portion arranged opposite to the first via-hole contact portion in the second direction, and connected to the eighth active portion in the second pixel driving circuit through a via hole;

a fourth via-hole contact portion connected between the first via-hole contact portion and the second via-hole contact portion, and connected to the power line in the first pixel driving circuit through a via hole;

a fifth via-hole contact portion connected between the first via-hole contact portion and the third via-hole contact portion, and connected to the power line in the second pixel driving circuit through a via hole, and the fifth via-hole contact portion and the fourth via-hole contact portion being arranged opposite to each other in the first direction;

where the first via-hole contact portion, the second via-hole contact portion, the third via-hole contact portion, the fourth via-hole contact portion and the fifth via-hole contact portion are configured to surround and define the hollow portion.

In some embodiments, the first bridging portion is arranged in a mirror symmetrical way with a mirror symmetry plane of the first pixel driving circuit and the second pixel driving circuit.

In some embodiments, the pixel driving circuit further includes a fourth transistor, a sixth transistor and a seventh transistor, a first electrode of the fourth transistor is connected to a data line, a second electrode of the fourth transistor is connected to a first electrode of the driving transistor, and a first electrode of the sixth transistor is connected to a second electrode of the driving transistor, a first electrode of the seventh transistor is connected to a second electrode of the sixth transistor, and a second electrode of the seventh transistor is connected to a second initial signal line;

the display panel further includes:

a first active layer located between the substrate base and the second conductive layer, where the first active layer includes:

a third active portion configured to define a channel region of the driving transistor;

a fourth active portion connected to a side of the third active portion, and configured to define a channel region of the fourth transistor;

a sixth active portion connected to a side of the third active portion away from the fourth active portion and configured to define a channel region of the sixth transistor;

a seventh active portion connected to a side of the sixth active portion away from the third active portion and configured to define a channel region of the seventh transistor;

a first conductive layer located between the first active layer and the second conductive layer, where the first conductive layer includes:

a second gate line, an orthographic projection of the second gate line on the substrate base extending along the first direction and covering an orthographic projection of the fourth active portion on the substrate base, and a partial structure of the second gate line being configured to form a gate of the fourth transistor;

an enabling signal line, an orthographic projection of the enabling signal line on the substrate base extending along the first direction and covering an orthographic projection of the sixth active portion on the substrate base, and a partial structure of the enabling signal line being configured to form a gate of the sixth transistor;

a second reset signal line, an orthographic projection of the second reset signal line on the substrate base extending along the first direction and covering an orthographic projection of the seventh active portion on the substrate base, and a partial structure of the second reset signal line being configured to form a gate of the seventh transistor;

a first conductive portion, an orthographic projection of the first conductive portion on the substrate base covering an orthographic projection of the third active portion on the substrate base, and the first conductive portion being configured to form the gate of the driving transistor and the second electrode of the capacitor;

where in a same pixel driving circuit, the orthographic projection of the first conductive portion on the substrate base is located between the orthographic projection of the second gate line on the substrate base and the orthographic projection of the enabling signal line on the substrate base;

the orthographic projection of the second reset signal line on the substrate base is located on a side of the orthographic projection of the enabling signal line on the substrate base away from the orthographic projection of the first conductive portion on the substrate base.

In some embodiments, the first direction is a row direction, and the second gate line in the pixel driving circuit of a row is reused as the second reset signal line in the pixel driving circuit of a previous row.

In some embodiments, the pixel driving circuit further includes a first transistor and a second transistor, a first electrode of the first transistor is connected to the gate of the driving transistor, a second electrode of the first transistor is connected to a first initial signal line, and a first electrode of the second transistor is connected to the gate of the driving transistor, a second electrode of the second transistor is connected to the second electrode of the driving transistor, and the display panel further includes:

a second active layer located between the second conductive layer and the fifth conductive layer, where the second active layer includes:

a first active portion configured to define a channel region of the first transistor;

a second active portion connected to the first active portion and configured to define a channel region of the second transistor;

a third conductive layer located between the second active layer and the fifth conductive layer, where the third conductive layer includes:

a first reset signal line, an orthographic projection of the first reset signal line on the substrate base covering an orthographic projection of the first active portion on the substrate base, and a partial structure of the first reset signal line being configured to form a top gate of the first transistor;

a first gate line, an orthographic projection of the first gate line on the substrate base covering an orthographic projection of the second active portion on the substrate base, and a partial structure of the first gate line being configured to form a top gate of the second transistor;

where in the same pixel driving circuit, the orthographic projection of the first gate line on the substrate base is located between the orthographic projection of the first conductive portion on the substrate base and the orthographic projection of the second gate line on the substrate base, the orthographic projection of the first reset signal line on the substrate base is located on a side of the orthographic projection of the second gate line on the substrate base away from the orthographic projection of the first conductive portion on the substrate base.

In some embodiments, the second conductive layer further includes:

the first initial signal line, an orthographic projection of the first initial signal line on the substrate base being located on a side of the orthographic projection of the first reset signal line on the substrate base away from the orthographic projection of the first conductive portion on the substrate base;

a third reset signal line connected to the first reset signal line through a via hole, an orthographic projection of the third reset signal line on the substrate base covering the orthographic projection of the first active portion on the substrate base, and a partial structure of the third reset signal line being configured to form a bottom gate of the first transistor;

a third gate line, an orthographic projection of the third gate line on the substrate base covering the orthographic projection of the second active portion on the substrate base, and a partial structure of the third gate line is configured to form a bottom gate of the second transistor.

A display apparatus is provided including the display panel, where the display panel includes a plurality of pixel driving circuits distributed in an array along a first direction and a second direction, where the first direction and the second direction intersect, the pixel driving circuit includes a driving transistor and a capacitor, a first electrode of the capacitor is connected to a gate of the driving transistor, and a second electrode of the capacitor is connected to a power line, and the display panel further includes:

a substrate base;

a second conductive layer located on a side of the substrate base, where the second conductive layer includes:

a plurality of second conductive portions, where the second conductive portion is configured to form the second electrode of the capacitor in the pixel driving circuit corresponding to the second conductive portion;

a fifth conductive layer located on a side of the second conductive layer away from the substrate base, where the fifth conductive layer includes:

a plurality of the power lines, where at least one of the plurality of second conductive portions being electrically connected to at least one of the plurality of the power lines;

where the display panel includes at least two adjacent pixel driving circuits, and the two adjacent pixel driving circuits include a first pixel driving circuit and a second pixel driving circuit distributed along the first direction;

the second conductive layer further include:

a second connection sub-portion connected between two second conductive portions in the first pixel driving circuit and the second pixel driving circuit respectively in the first direction;

where the pixel driving circuit further includes a fifth transistor, where a first electrode of the fifth transistor is connected to the power line, and a second electrode of the fifth transistor is connected to a first electrode of the driving transistor;

the first active layer includes:

a fifth active portion configured to define a channel region of the fifth transistor;

an eighth active portion connected to a side of the fifth active portion away from the third active portion;

the display panel further includes:

a first conductive layer located between the first active layer and the second conductive layer, where the first conductive layer includes:

an enabling signal line, an orthographic projection of the enabling signal line on the substrate base extending along the first direction and covering an orthographic projection of the fifth active portion on the substrate base, and a partial structure of the enabling signal line being configured to form a gate of the fifth transistor;

a fourth conductive layer located between the second conductive layer and the fifth conductive layer, where the fourth conductive layer includes:

a first bridging portion connected to the eighth active portion in the first pixel driving circuit and the eighth active portion in the second pixel driving circuit through a via hole, respectively, and the first bridging portion being connected to the power line through a via hole.

It should be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the present disclosure and together with the description serve to explain principles of the present disclosure. Obviously, the drawings in the following description are only some embodiments of the present disclosure, and for those ordinary skilled in the art, other drawings may also be obtained from these drawings without creative effort.

DETAILED DESCRIPTION

Figure 1:
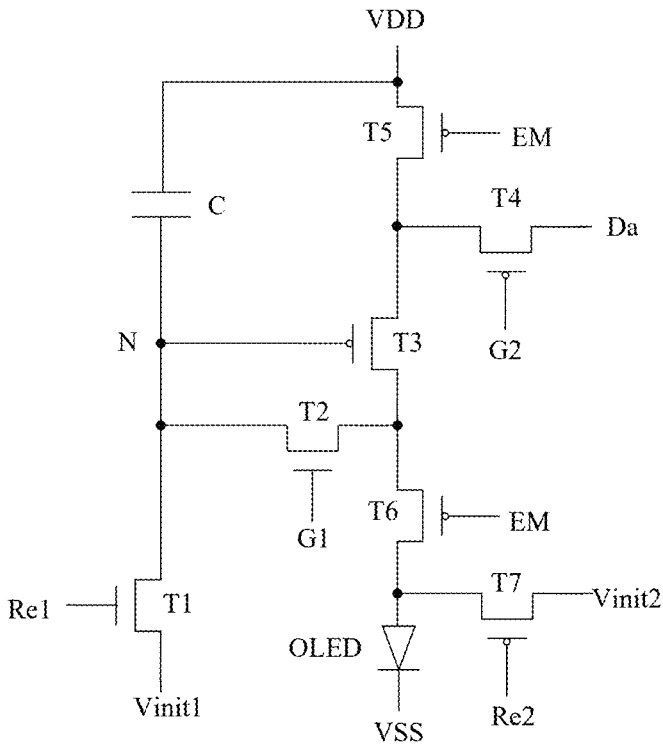
FIG. 1 is a schematic diagram of a circuit structure of a pixel driving circuit in the related art.

Example embodiments will now be described more fully with reference to the accompanying drawings. Example embodiments, however, can be implemented in various forms and should not be construed as limited to examples set forth herein; rather, these embodiments are provided such that the present disclosure will be thorough and complete, and will fully convey the concept of example embodiments to those skilled in the art. The same reference numerals in the drawings denote the same or similar structures, and thus their detailed descriptions will be omitted.

The terms "a", "an", "the" are used to indicate the presence of one or more elements/components/etc; and the terms "including" and "having" are used to indicate an open-ended inclusive meaning and means that additional elements/components/etc may be present in addition to the listed elements/components/etc.

As shown in FIG. 1, a schematic diagram of a circuit structure of a pixel driving circuit in the related art is shown. The pixel driving circuit may include: a driving transistor T3, a first transistor T1, a second transistor T2, a fourth transistor T4, a fifth transistor T5, a sixth transistor T6, a seventh transistor T7, and a capacitor C. A first electrode of the fourth transistor T4 is connected to a data signal terminal Da, a second electrode of the fourth transistor T4 is connected to a first electrode of the driving transistor T3, and a gate of the fourth transistor T4 is connected to a second gate driving signal terminal G2. A first electrode of the fifth transistor T5 is connected to a first power terminal VDD, a second electrode of the fifth transistor T5 is connected to the first electrode of the driving transistor T3, and a gate of the fifth transistor T5 is connected to an enabling signal terminal EM. A gate of the driving transistor T3 is connected to a node N. A first electrode of the second transistor T2 is connected to the node N, a second electrode of the second transistor T2 is connected to a second electrode of the driving transistor T3, and a gate of the second transistor T2 is connected to a first gate driving signal terminal G1. A first electrode of the sixth transistor T6 is connected to the second electrode of the driving transistor T3, a second electrode of the sixth transistor T6 is connected to a first electrode of the seventh transistor T7, a gate of the sixth transistor T6 is connected to the enabling signal terminal EM. A second electrode of the seventh transistor T7 is connected to a second initial signal terminal Vinit2 and a gate of the seventh transistor T7 is connected to a second reset signal terminal Re2. A first electrode of the first transistor T1 is connected to the node N, a second electrode of the first transistor T1 is connected to a first initial signal terminal Vinit1, and a gate of the first transistor T1 is connected to a first reset signal terminal Re1. A first electrode of the capacitor C is connected to the node N, and a second electrode of the capacitor C is connected to the first power terminal VDD. The pixel driving circuit may be connected to a light emitting unit OLED for driving the light emitting unit OLED to emit light, and the light emitting unit OLED may be connected between the second electrode of the sixth transistor T6 and a second power terminal VSS. The first transistor T1 and the second transistor T2 may be N-type transistors, and for example, the first transistor T1 and the second transistor T2 may be N-type metal oxide transistors. The N-type metal oxide transistors have a relatively small leakage current, so as to avoid leakage of the node N through the first transistor T1 and the second transistor T2 during a light-emitting phase. Also, the driving transistor T3, the fourth transistor T4, the fifth transistor T5, the sixth transistor T6, and the seventh transistor T7 may be P-type transistors, and for example, the driving transistor T3, the fourth transistor T4, the fifth transistor T5, the sixth transistor T6, and the seventh transistor T7 may be P-type low-temperature multi-crystal silicon transistor. The P-type low-temperature multi-crystal silicon transistors have a relatively high carrier mobility, thereby facilitating the realization of a display panel with high resolution, high response speed, high pixel density, and high opening rate. The first initial signal terminal and the second initial signal terminal may output the same or different voltage signals depending on the actual situation.

Figure 2:
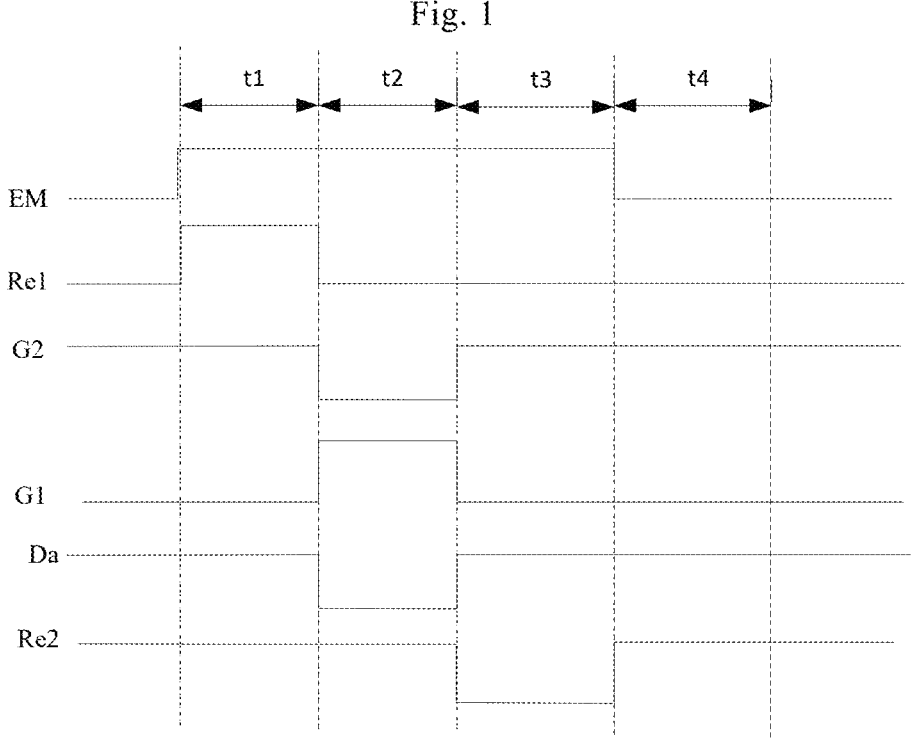
FIG. 2 is a timing diagram of each node in a driving method of the pixel driving circuit shown in FIG. 1.

As shown in FIG. 2, A timing diagram of each node in a driving method of the pixel driving circuit of FIG. 1 is shown. G1 indicates timing of the first gate driving signal terminal G1, G2 indicates timing of a second gate driving signal terminal G2, Re1 indicates timing of the first reset signal terminal Re1, Re2 indicates timing of the second reset signal terminal Re2, EM indicates timing of the enabling signal terminal EM, and Da indicates timing of the data signal terminal Da. The driving method of the pixel driving circuit may include a first reset phase t1, a compensation phase t2, a second reset phase t3, and an emitting phase t4. In the first reset phase t1: the first reset signal terminal Re1 outputs a high level signal, the first transistor T1 is turned on, and the first initial signal terminal Vinit1 inputs an initial signal to the node N. In the compensation phase t2: the first gate driving signal terminal G1 outputs a high level signal, the second gate driving signal terminal G2 outputs a low level signal, the fourth transistor T4 and the second transistor T2 are turned on, while the data signal terminal Da outputs a driving signal to write a voltage Vdata+Vth (i.e. a sum of voltage Vdata and Vth) to the node N, where Vdata is a voltage of the driving signal, Vth is a threshold voltage of the driving transistor T3. In the second reset phase t3, the second reset signal terminal Re2 outputs a low level signal, the seventh transistor T7 is turned on, and the second initial signal terminal Vinit2 inputs an initial signal to the second electrode of the sixth transistor T6. In the emitting phase t4: the enabling signal terminal EM outputs a low level signal, the sixth transistor T6 and the fifth transistor T5 are turned on, and the driving transistor T3 emits light under action of the voltage Vdata+Vth stored in the capacitor C.

A formula for an output current of a driving transistor is as follows $$I=(\mu WCox/2L)(Vgs-Vth)^2$$

where I is an output current of a driving transistor; μ is a carrier mobility; Cox is a capacitance of gate per unit area, W is a width of a channel of a driving transistor, L is a length of a channel of a driving transistor, Vgs is a gate-source voltage difference of a driving transistor, and Vth is a threshold voltage of a driving transistor. According to the above formula for the output current of the driving transistor, a gate voltage Vdata+Vth and a source voltage VDD of the driving transistor in the pixel driving circuit of the present disclosure are brought into the above formula to obtain: I=(μ WCox/2L) (Vdata+Vth−Vdd−Vth)$^2$. This pixel driving circuit may avoid influence of the threshold of the driving transistor on its output current.

However, in the display panel, there is a voltage drop in a power line itself used to provide the first power terminal, which causes a pressure difference at the first power terminal at different positions of the display panel, resulting in uneven display of the display panel.

Figures 3, 4:
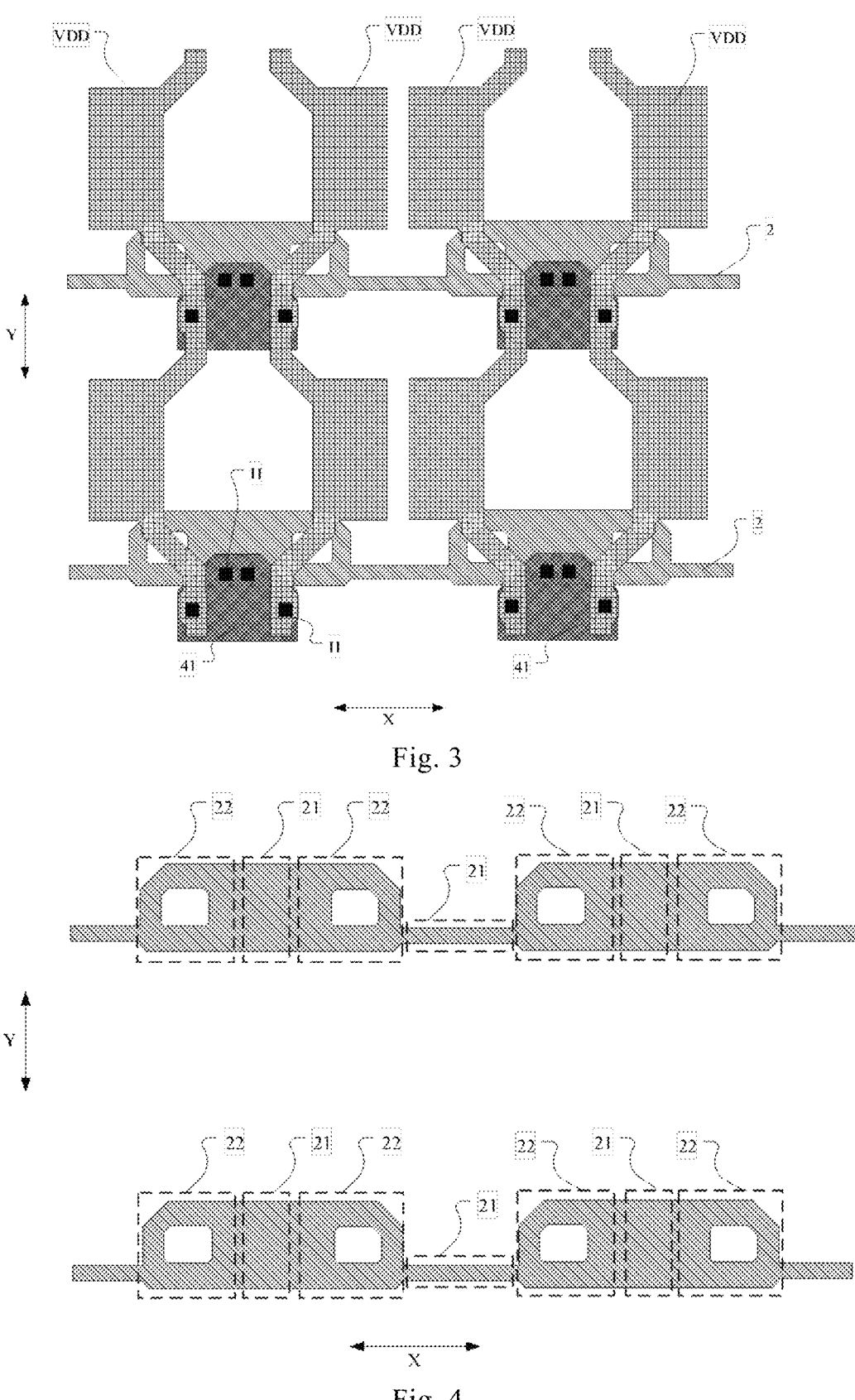
FIG. 3 is a structural layout of an exemplary embodiment of a display panel of the present disclosure.
FIG. 4 is a structural layout of a second conductive layer in FIG. 3.
Figures 5, 6:
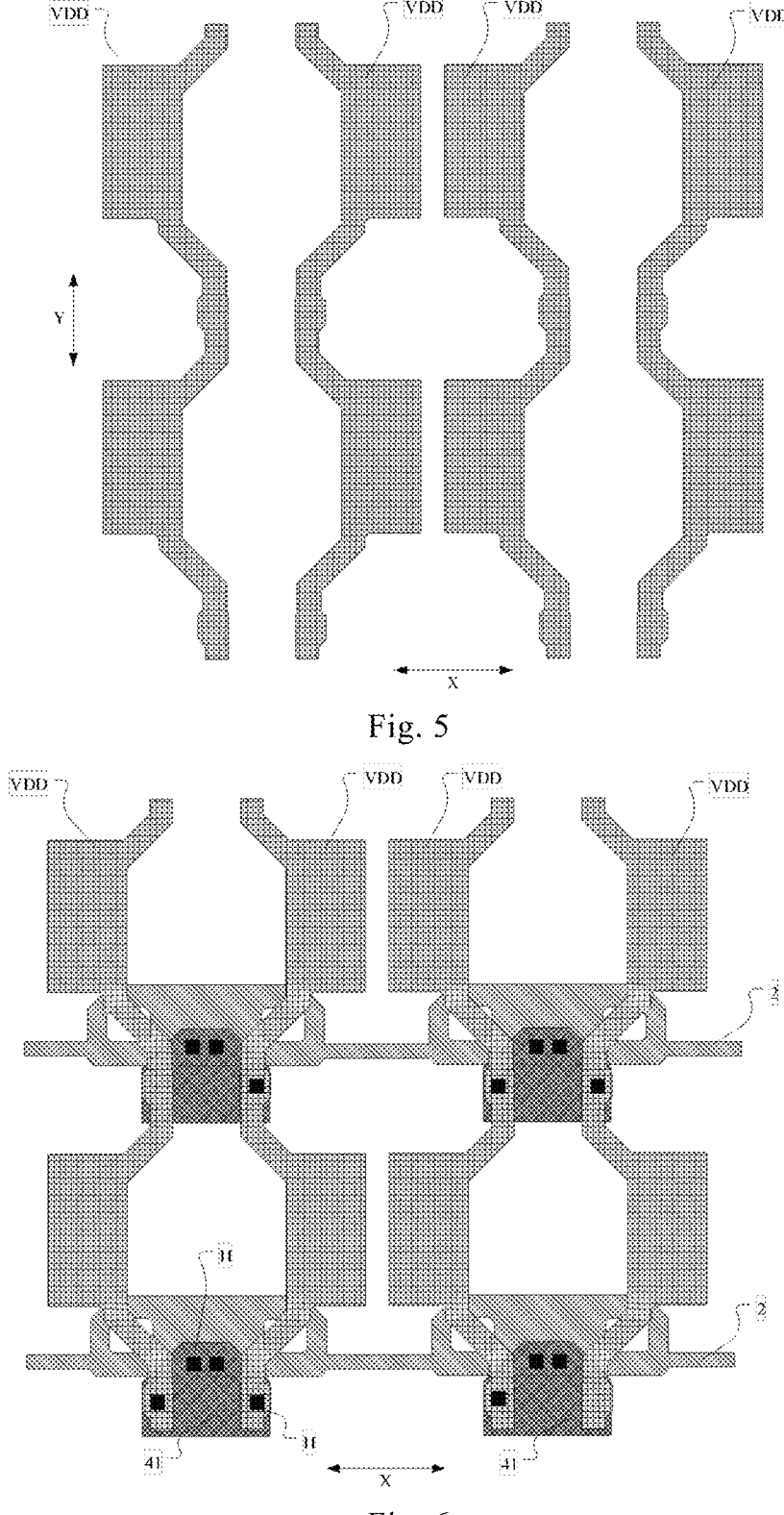
FIG. 5 is a structural layout of a fifth conductive layer in FIG. 3.
FIG. 6 is a structural layout of another exemplary embodiment of a display panel of the present disclosure.

Based on this, the present exemplary embodiment provides a display panel, the display panel may include a plurality of pixel driving circuits distributed in an array along a first direction and a second direction, and the first direction and the second direction intersect, for example, the first direction may be a row direction, and the second direction may be a column direction. Structure of the pixel driving circuit in the display panel may be shown in FIG. 1. The display panel may further include: a substrate base, a second conductive layer and a fifth conductive layer, as shown in FIGS. 3-5. FIG. 3 is a structural layout of an exemplary embodiment of a display panel of the present disclosure, FIG. 4 is a structural layout of a second conductive layer in FIG. 3, and FIG. 5 is a structural layout of a fifth conductive layer in FIG. 3. The second conductive layer may be located on a side of the substrate base, and the second conductive layer may include: a plurality of second conductive portions 22, the plurality of second conductive portions may be arranged in one-to-one correspondence with the plurality of pixel driving circuits, and the second conductive portion 22 may be configured to form the second electrode of the capacitor in the pixel driving circuit corresponding to the second conductive portion, and the plurality of the second conductive portions distributed in the first direction X are connected to form a conductive wire 2. The fifth conductive layer may be located on a side of the second conductive layer away from the substrate base, and the fifth conductive layer may include: a plurality of power lines VDD, orthographic projections of the power lines VDD on the substrate base are spaced apart from each other along the first direction X and extend along the second direction Y, and each conductive wire 2 may be connected to each power line VDD.

In the present exemplary embodiment, a plurality of power lines VDD and the plurality of conductive wires 2 may form a grid structure, and the power lines of the grid structure have a relatively small resistance, so as to improve display uniformity of the display panel.

In the present exemplary embodiment, as shown in FIGS. 3 and 4, the second conductive layer may further include a plurality of first connection portions 21 connected between the adjacent second conductive portions 22 in the first direction. The plurality of second conductive portions 22 spaced apart from each other in the first direction X may be connected through the first connection portions to form conductive wires 2. It should be understood that in other exemplary embodiments, the first connection portions 21 may also be located in other conductive layers.

In the present exemplary embodiment, the power line VDD and the conductive wire 2 may be connected through a via hole. As shown in FIG. 3, the display panel may further include a fourth conductive layer, the fourth conductive layer may be located between the second conductive layer and the fifth conductive layer, and the fourth conductive layer may include a plurality of first bridging portions 41. The first bridging portion 41 may be connected to the first connection portion 21 through the via hole H, and the power line VDD may be connected to the first bridging portion 41 through the via hole H, such that the power line VDD may be connected to the conductive wire 2. It should be noted that black squares in the present exemplary embodiment indicate via holes, and the present exemplary embodiment only marks positions of some via holes. In addition, in other exemplary embodiments, the power line VDD may also be directly connected to the second conductive portion through a via hole.

In the present exemplary embodiment, each conductive wire 2 may be connected to each power line VDD. It should be understood that in other exemplary embodiments, the conductive wires 2 may also be connected to only a part of the power lines VDD. For example, as shown in FIG. 6, a structural layout of another exemplary embodiment of a display panel of the present disclosure is shown, the conductive wire 2 at a first row is connected to the power lines VDD at second to fourth columns, and the conductive wire 2 at a second row is connected to the power lines VDD at first to third columns. This display panel may also reduce the voltage drop of the power line.

Figure 7:
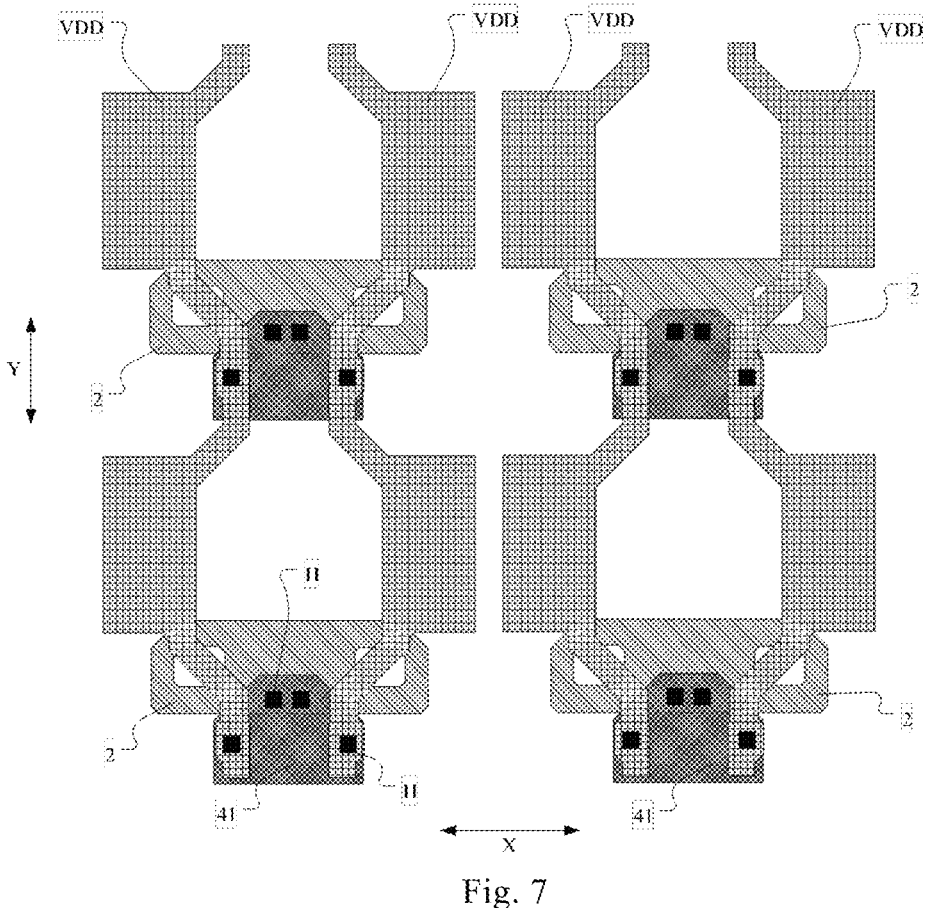
FIG. 7 is a structural layout of another exemplary embodiment of a display panel of the present disclosure.
Figure 8:
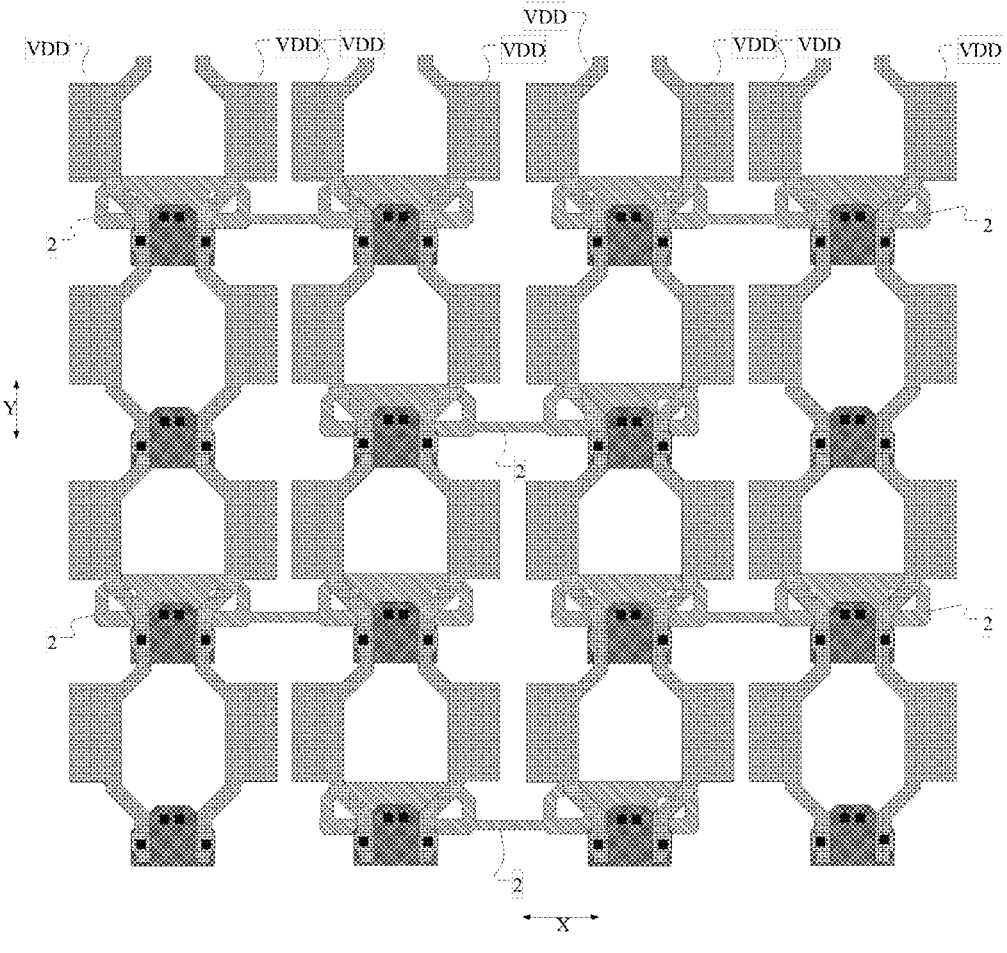
FIG. 8 is a structural layout of another exemplary embodiment of a display panel of the present disclosure.

In the present exemplary embodiment, all the second conductive portions 22 spaced apart from each other in the first direction X in the display panel are connected in sequence to form the conductive wires 2. It should be understood that in other exemplary embodiments, the conductive wires 2 may also be formed by connecting only a part of the conductive portions 22. For example, as shown in FIG. 7, a structural layout of another exemplary embodiment of a display panel of the present disclosure is shown, every two adjacent conductive portions 22 are connected in the first direction X to form a conductive wire 2, and this display panel may also reduce the voltage drop of the power line. As another example, as shown in FIG. 8, a structural layout of another exemplary embodiment of a display panel of the present disclosure is shown. Each plurality of second conductive portions 22 form a conductive wire 2, the display panel may include a plurality of conductive wires 2 distributed along row and column, the conductive wires 2 at adjacent rows and adjacent columns are staggered in the row direction, and that is, regions covered by movements of orthographic projections of two conductive wires 2, located in the adjacent rows and adjacent columns, on the substrate base in the column direction are partially overlapped. The staggered conductive wires 2 may be connected to at least two power lines VDD together. This display panel may also reduce the voltage drop of the power line.

The display panel of the present disclosure may further include a pixel driving circuit of other structure. As long as the capacitor of the pixel driving circuit is connected to the power line, the corresponding display panel may adopt the above structure to reduce the voltage drop of the power line itself.

It should be noted that in the present exemplary embodiment, an orthographic projection of a structure on the substrate base extends along a certain direction, which may be understood as that the orthographic projection of the structure on the substrate base extends along the direction as a whole, and that is, the orthographic projection of the structure on the substrate base may extend in a straight line or bend along the direction. Different structural parts in the same structural film layer (such as, the second conductive layer and the fifth conductive layer) may be formed by a patterning process at one time. The structural layer A is located on a side of a structural layer B away from the substrate base. It may be understood that the structural layer A is formed on the side of the structural layer B away from the substrate base. When the structure layer B is a patterned structure, a partial structure of the structure layer A may also be located at a same physical height of the structure layer B or lower than the physical height of the structure layer B, and the substrate base is a height reference.

Figure 9:
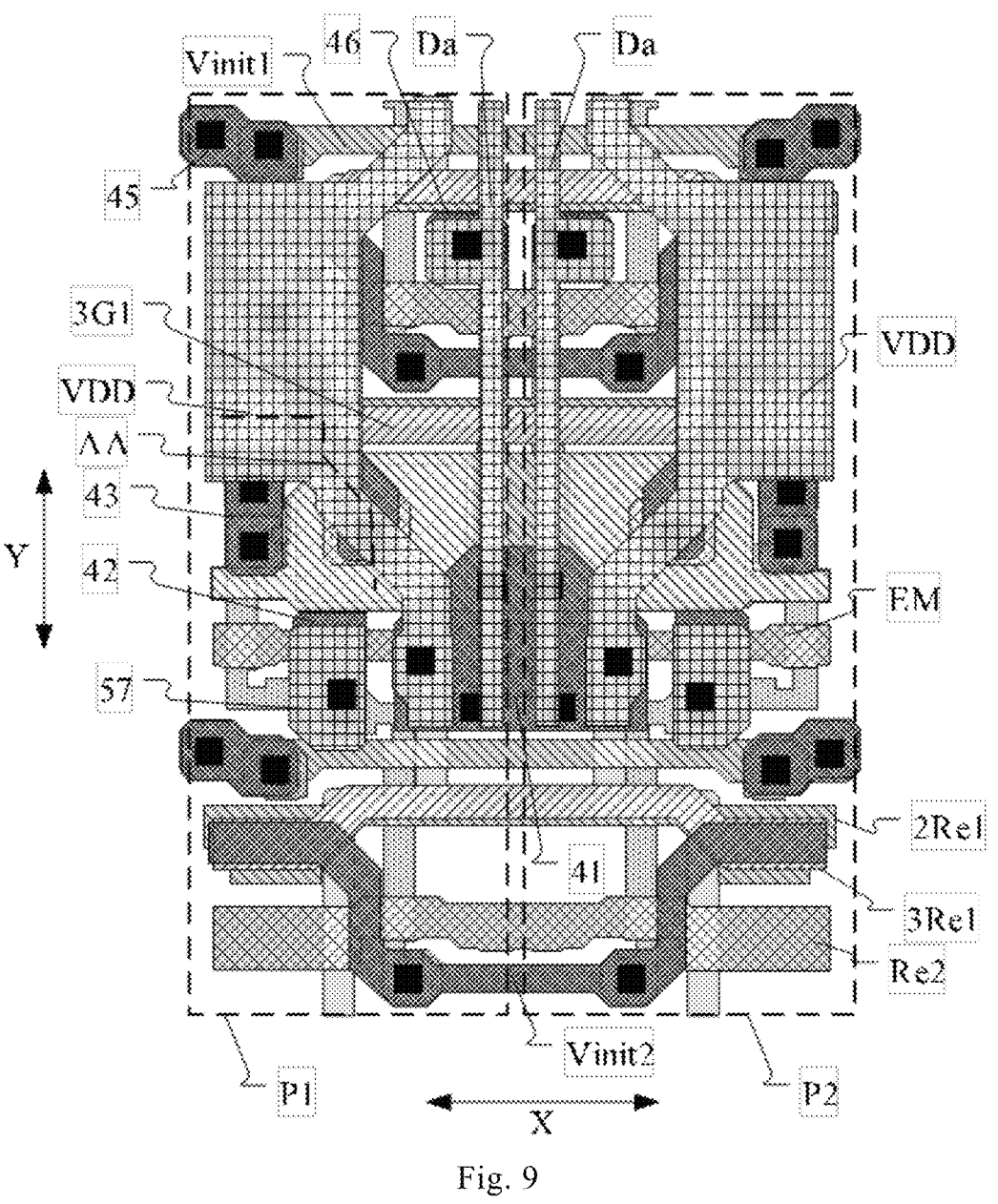
FIG. 9 is a structural layout of another exemplary embodiment of a display panel of the present disclosure.
Figures 10, 11:
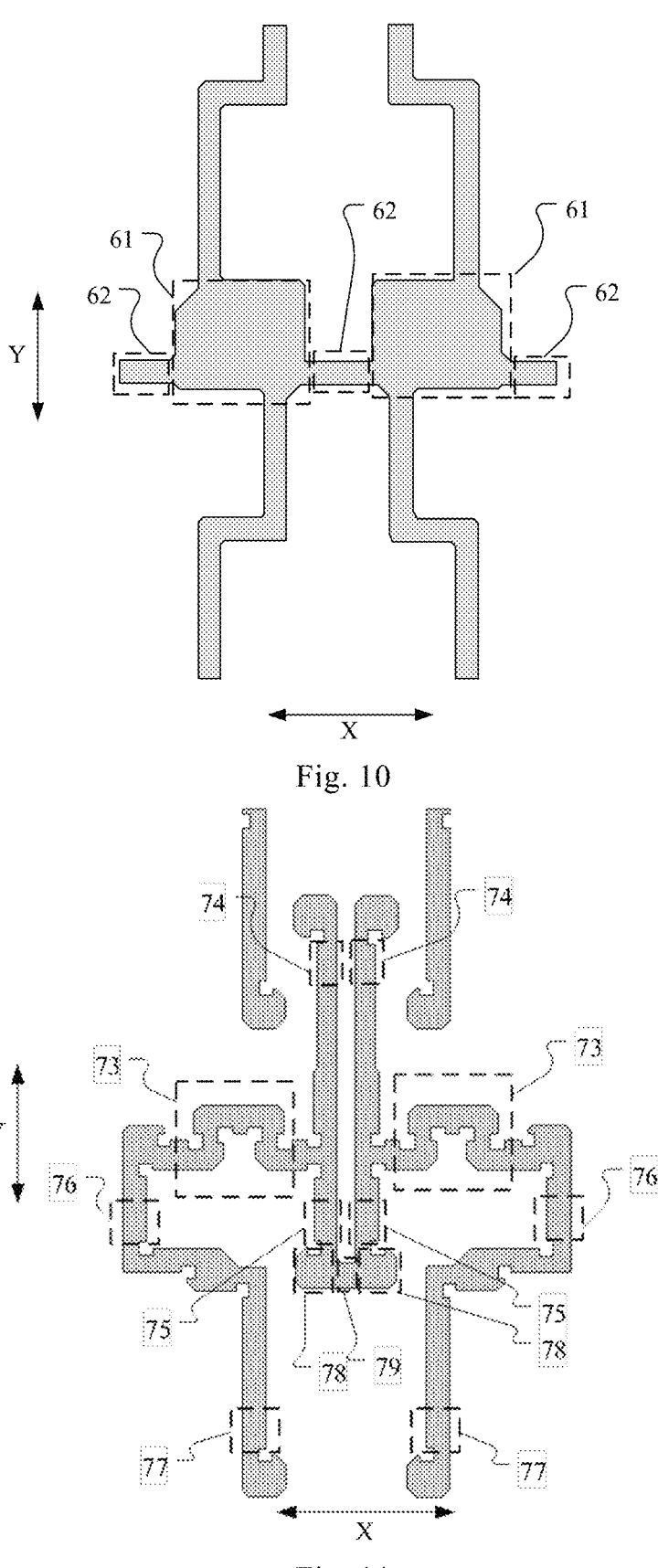
FIG. 10 is a structural layout of a light shielding layer in FIG. 9.
FIG. 11 is a structural layout of a first active layer in FIG. 9.
Figures 12, 13:
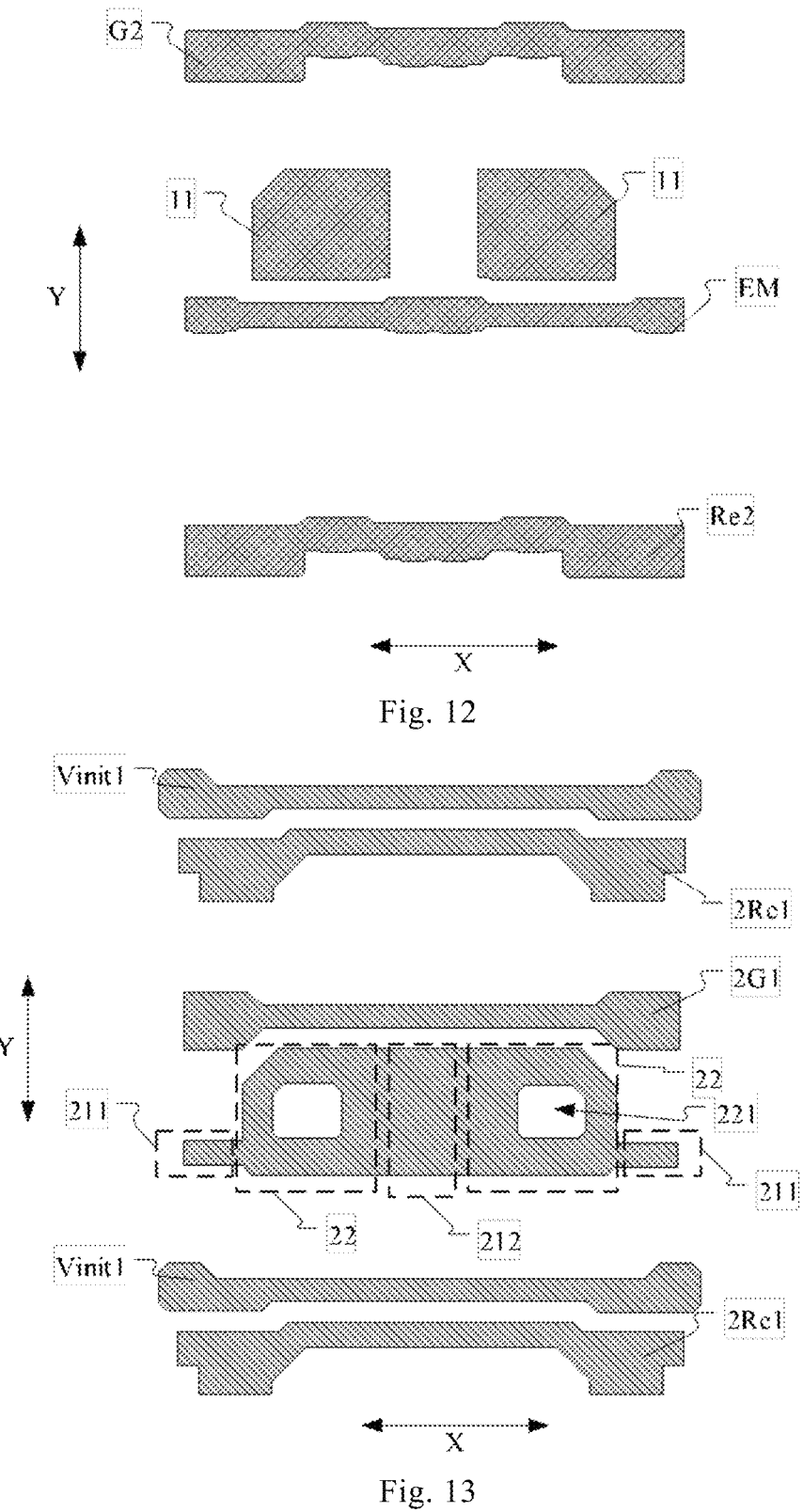
FIG. 12 is a structural layout of a first conductive layer in FIG. 9.
FIG. 13 is a structural layout of a second conductive layer in FIG. 9.
Figure 14:
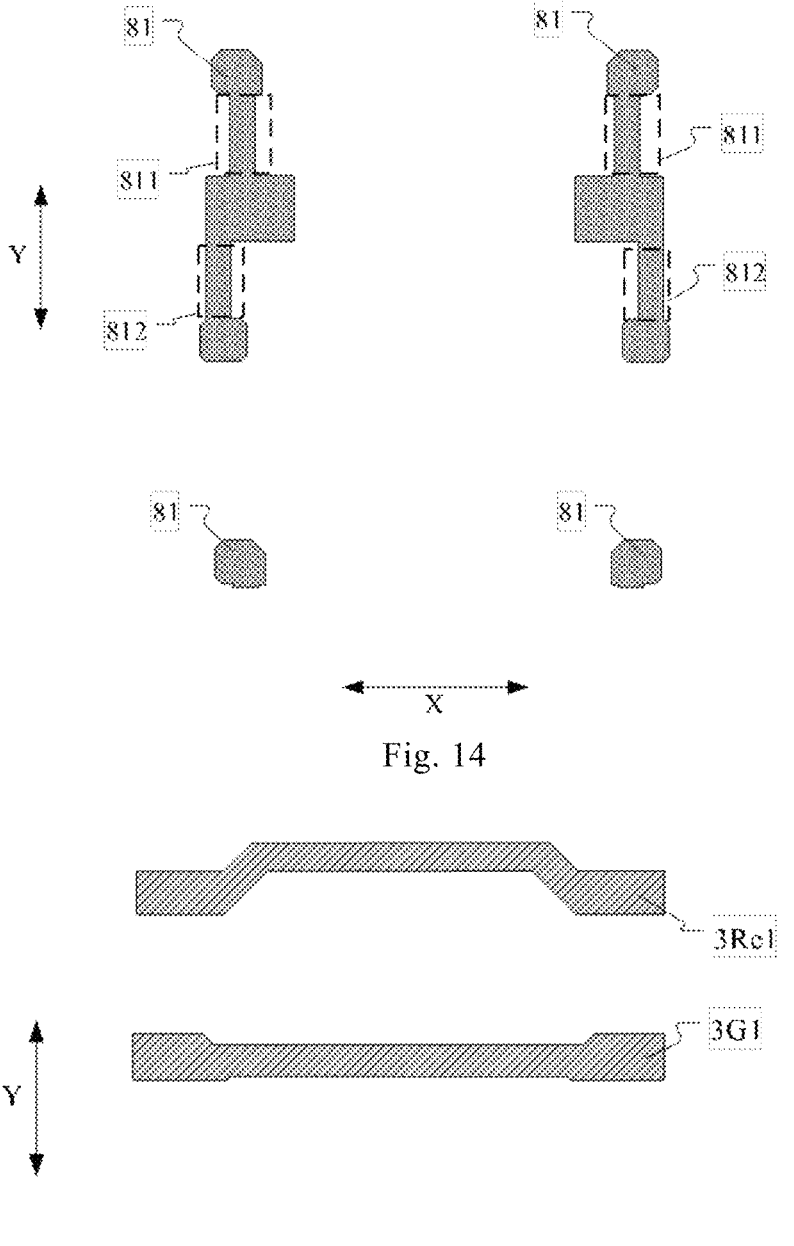
FIG. 14 is a structural layout of a second active layer in FIG. 9.
Figure 15:
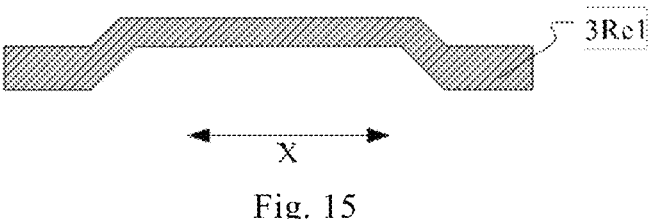
FIG. 15 is a structural layout of a third conductive layer in FIG. 9.
Figures 16, 17:
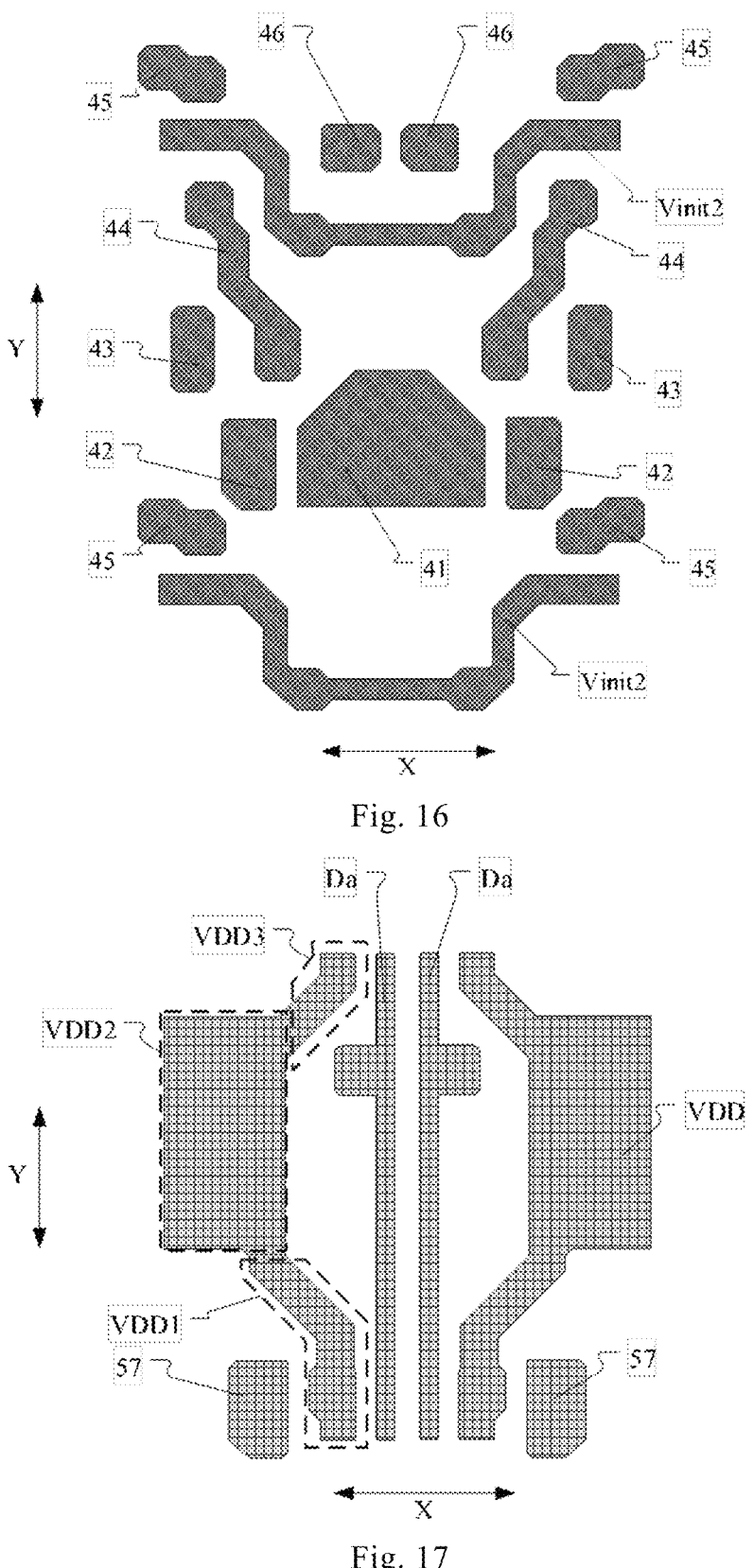
FIG. 16 is a structural layout of a fourth conductive layer in FIG. 9.
FIG. 17 is a structural layout of a fifth conductive layer in FIG. 9.
Figures 18, 19:
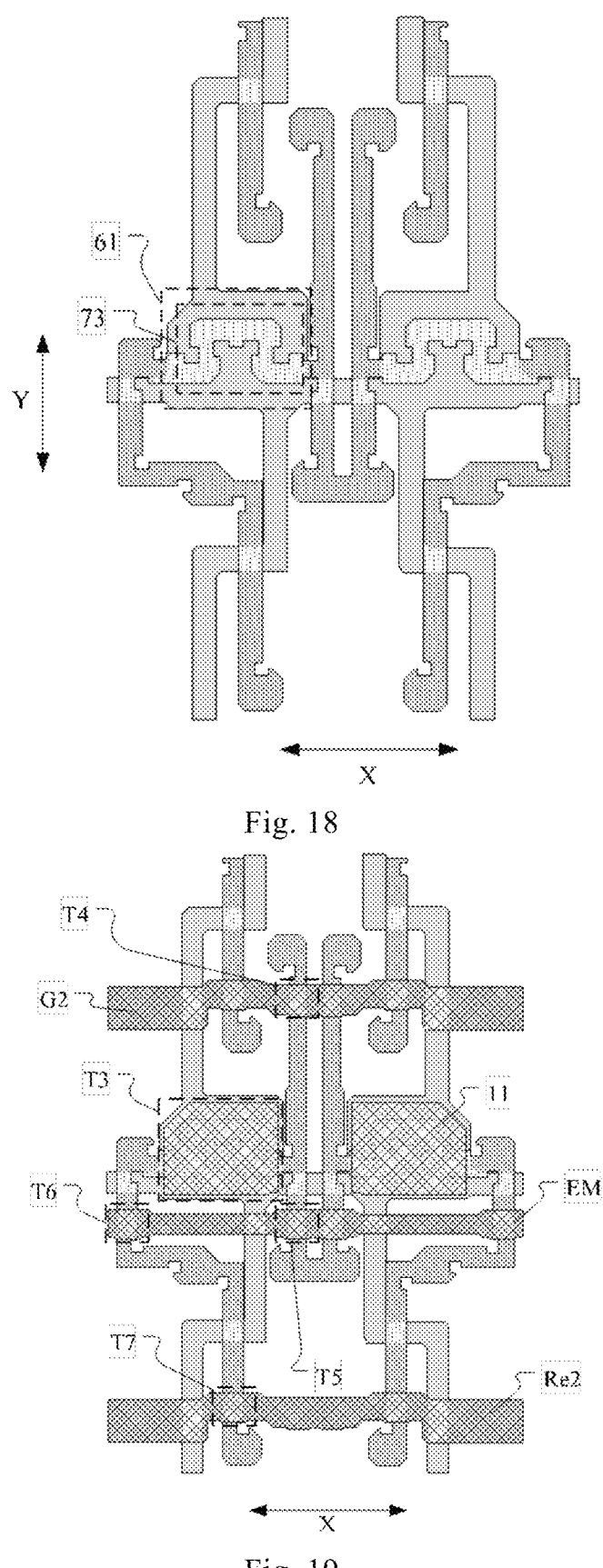
FIG. 18 is a structural layout of a light shielding layer and a first active layer in FIG. 9.
FIG. 19 is a structural layout of a light shielding layer, a first active layer and a first conductive layer in FIG. 9.
Figures 20, 21:
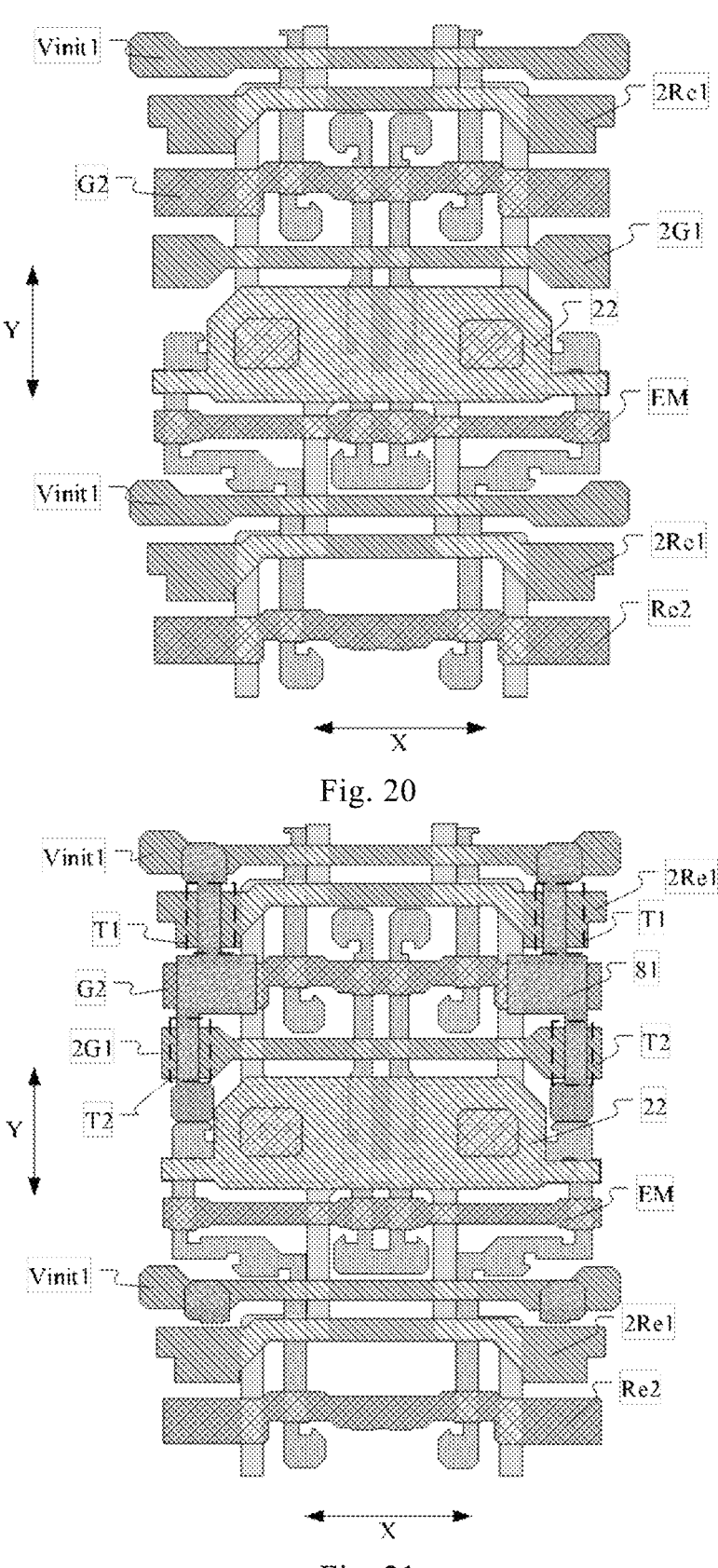
FIG. 20 is a structural layout of a light shielding layer, a first active layer, a first conductive layer and a second conductive layer in FIG. 9.
FIG. 21 is a structural layout of a light shielding layer, a first active layer, a first conductive layer, a second conductive layer and a second active layer in FIG. 9.
Figure 22:
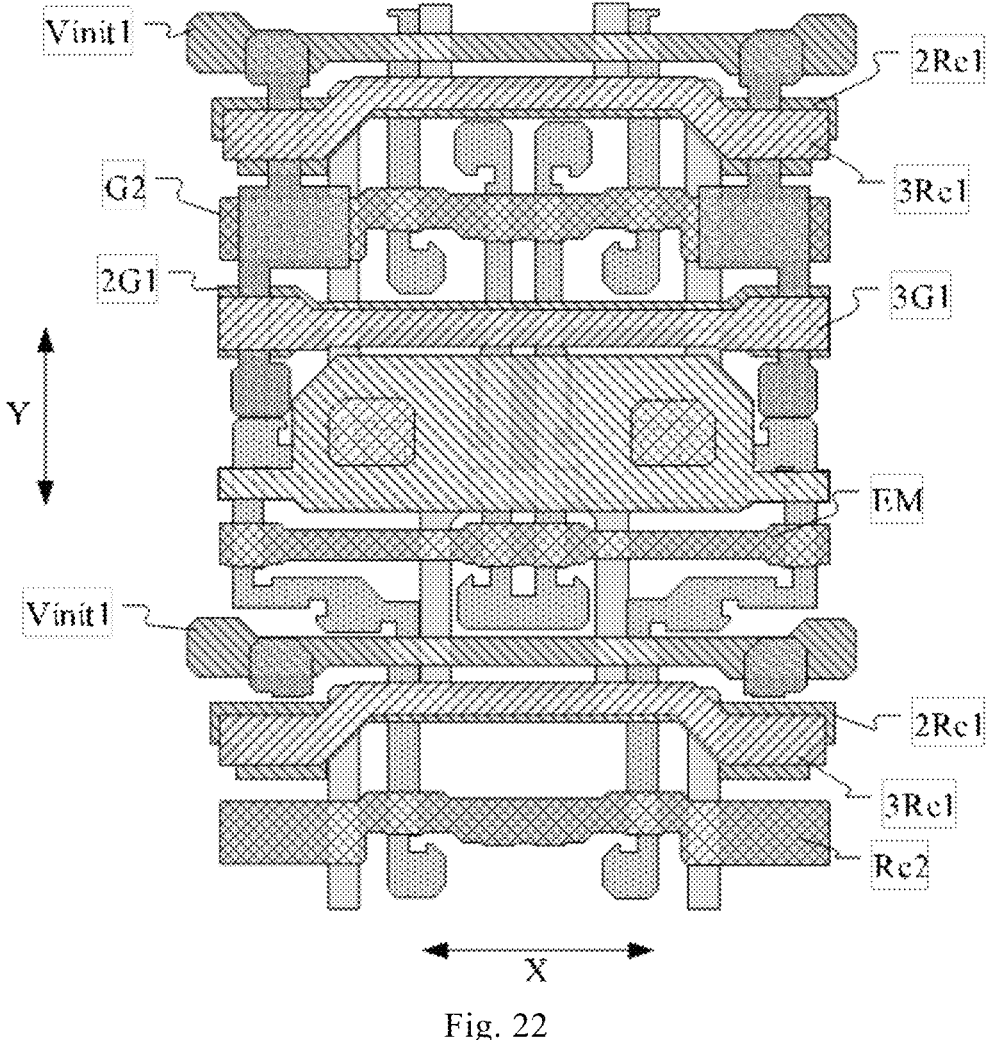
FIG. 22 is a structural layout of a light shielding layer, a first active layer, a first conductive layer, a second conductive layer, a second active layer and a third conductive layer in FIG. 9.
Figure 23:
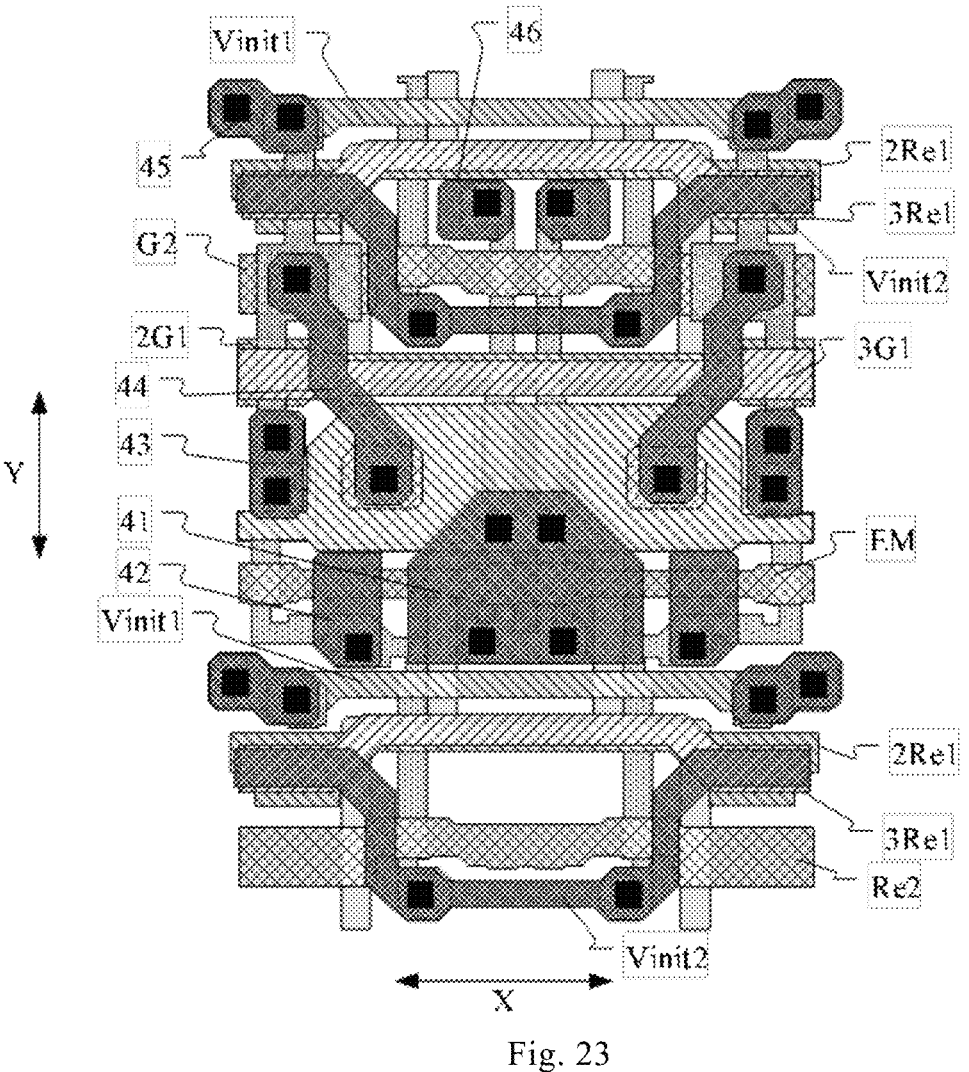
FIG. 23 is a structural layout of a light shielding layer, a first active layer, a first conductive layer, a second conductive layer, a second active layer, a third conductive layer and a fourth conductive layer in FIG. 9.

The present exemplary embodiment also provides another display panel, and the display panel may include a substrate base, a light shielding layer, a first active layer, a first conductive layer, a second conductive layer, a second active layer, a third conductive layer, a fourth conductive layer, and a fifth conductive layer, which are stacked in sequence, an insulating layer may be arranged between the above layers. As shown in FIGS. 9-23, FIG. 9 is a structural layout of another exemplary embodiment of a display panel of the present disclosure, FIG. 10 is a structural layout of a light shielding layer in FIG. 9, FIG. 11 is a structural layout of a first active layer in FIG. 9, FIG. 12 is a structural layout of a first conductive layer in FIG. 9, FIG. 13 is a structural layout of a second conductive layer in FIG. 9, FIG. 14 is a structural layout of a second active layer in FIG. 9, FIG. 15 is a structural layout of a third conductive layer in FIG. 9, FIG. 16 is a structural layout of a fourth conductive layer in FIG. 9, FIG. 17 is a structural layout of a fifth conductive layer in FIG. 9, FIG. 18 is a structural layout of a light shielding layer and a first active layer in FIG. 9, FIG. 19 is a structural layout of a light shielding layer, a first active layer and a first conductive layer in FIG. 9, FIG. 20 is a structural layout of a light shielding layer, a first active layer, a first conductive layer and a second conductive layer in FIG. 9, FIG. 21 is a structural layout of a light shielding layer, a first active layer, a first conductive layer, a second conductive layer and a second active layer in FIG. 9, FIG. 22 is a structural layout of a light shielding layer, a first active layer, a first conductive layer, a second conductive layer, a second active layer and a third conductive layer in FIG. 9, FIG. 23 is a structural layout of a light shielding layer, a first active layer, a first conductive layer, a second conductive layer, a second active layer, a third conductive layer and a fourth conductive layer in FIG. 9. The display panel may include a plurality of pixel driving circuits shown in FIG. 1. As shown in FIG. 9, the plurality of pixel driving circuits may include a first pixel driving circuit P1 and a second pixel driving circuit P2 that are adjacent to each other in the first direction X, and the first pixel driving circuit P1 and the second pixel driving circuit P2 may be arranged in a mirror symmetrical way. The first pixel driving circuit P1 and the second pixel driving circuit P2 may form a repeating unit, and the display panel may include a plurality of repeating units distributed in an array in the first direction X and the second direction Y. The first direction X and the second direction Y may intersect, for example, the first direction may be a row direction, and the second direction may be a column direction.

As shown in FIGS. 9, 10 and 18, the light shielding layer may include a plurality of light shielding portions 61 distributed in the first direction X and a second connection portion 62 connected between the light shielding portions 61. The light shielding layer may be in a conductor structure, for example, the light shielding layer may be a light shielding metal layer.

As shown in FIGS. 9, 11, and 19, the first active layer may include a third active portion 73, a fourth active portion 74, a fifth active portion 75, a sixth active portion 76, a seventh active portion 77, an eighth active portion 78, and a ninth active portion 79. The third active portion 73 may be configured to define a channel region of the driving transistor T3; the fourth active portion 74 may be configured to define a channel region of the fourth transistor T4; the fifth active portion 75 may be configured to define a channel region of the fifth transistor T5; the sixth active portion 76 may be configured to define a channel region of the sixth transistor T6; the seventh active portion 77 may be configured to define a channel region of the seventh transistor T7; the eighth active portion 78 is connected to a side of the fifth active portion 75 away from the third active portion 73, and the ninth active portion 79 is connected between the eighth active portion 78 in the first pixel driving circuit P1 and the eighth active portion 78 in the second pixel driving circuit P2. The eighth active portion 78 may be configured to form a first electrode of the fifth transistor. In the present exemplary embodiment, the eighth active portions in the adjacent two pixel driving circuits are connected through the ninth active portion 79, such that the voltage difference at the first power terminal in the adjacent pixel driving circuits may be reduced. As shown in FIG. 18, an orthographic projection of a light shielding portion 61 on the substrate base may cover an orthographic projection of the third active portion 73 on the substrate base, and the light shielding portion 61 may reduce the influence of light on characteristics of the driving transistor. The first active layer may be formed of polysilicon material. Accordingly, the driving transistor T3, the fourth transistor T4, the fifth transistor T5, the sixth transistor T6, and the seventh transistor T7 may be P-type low-temperature polysilicon thin film transistors.

As shown in FIGS. 9, 12 and 19, the first conductive layer may include: a first conductive portion 11, a second gate line G2, an enabling signal line EM, and a second reset signal line Re2. The second gate line G2 may be used to provide a second gate driving signal terminal in FIG. 1. The enabling signal line EM may be used to provide an enabling signal terminal in FIG. 1. The second reset signal line Re2 may be used to provide a second reset signal terminal in FIG. 1. An orthographic projection of the second gate line G2 on the substrate base, an orthographic projection of the enabling signal line EM on the substrate base, and an orthographic projection of the second reset signal line Re2 on the substrate base may all extend along the first direction X. The orthographic projection of the second gate line G2 on the substrate base covers an orthographic projection of the fourth active portion 74 on the substrate base, and a partial structure of the second gate line G2 is configured to form a gate of the fourth transistor. An orthographic projection of the enabling signal line EM on the substrate base covers an orthographic projection of the fifth active portion 75 on the substrate base and an orthographic projection of the sixth active portion 76 on the substrate base. Some structures of the enabling signal line EM may be configured to form a gate of the fifth transistor T5 and a gate of the sixth transistor T6, respectively. An orthographic projection of the second reset signal line Re2 on the substrate base may cover an orthographic projection of the seventh active portion 77 on the substrate base, and a partial structure of the second reset signal line Re2 may be configured to form a gate of the seventh transistor T7. An orthographic projection of the first conductive portion 11 on the substrate base covers an orthographic projection of the third active portion 73 on the substrate base. The first conductive portion 11 may be configured to form a gate of the driving transistor T3 and a first electrode of the capacitor. The first direction X may be a row direction. As shown in FIG. 19, the second gate line G2 in the pixel driving circuit of a row may be reused as the second reset signal line Re2 in the pixel driving circuit of a previous row. This arrangement may improve integration of the pixel driving circuit and reduce a layout area of the pixel driving circuit. The light shielding layer may be connected to a stable power terminal. For example, the light shielding layer may be connected to the first power terminal, the first initial signal terminal, the second initial signal terminal, etc. in FIG. 1. The light shielding portion 61 may stabilize a voltage of the first conductive portion 11, thereby reducing voltage fluctuation of the gate of the driving transistor T3 in the light-emitting phase. In addition, the display panel may use the first conductive layer as a mask to conduct a conductive treatment on the first active layer, that is, a region covered by the first conductive layer in the first active layer may be formed as a channel region of the transistor, and a region not covered by the first conductive layer may be formed as a conductor structure.

As shown in FIGS. 9, 13 and 20, the second conductive layer may include a first initial signal line Vinit1, a third reset signal line 2Re1, a third gate line 2G1, and a plurality of second conductive portions 22. The first initial signal line Vinit1 is used to provide the first initial signal terminal in FIG. 1, the third reset signal line 2Re1 may be used to provide the first reset signal terminal in FIG. 1, and the third gate line 2G1 may be used to provide the first gate driving signal terminal in FIG. 1. An orthographic projection of the first initial signal line Vinit1 on the substrate base, an orthographic projection of the third reset signal line 2Re1 on the substrate base, and an orthographic projection of the third gate line 2G1 on the substrate base may all extend along the first direction X. As shown in FIG. 13, the second conductive layer may further include a plurality of first connection portions, and the plurality of first connection portions may include: a second connection sub-portion 212 connected between two second conductive portions 22 in a same repeating unit, and a first connection sub-portion 211 connected between two second conductive portions 22 in adjacent repeating units. As shown in FIG. 20, between the two adjacent pixel driving circuits in the same group, the orthographic projection of the first connection sub-portion 211 on the substrate base may at least partially overlap with the orthographic projection of the second connection portion 62 on the substrate base, and the orthographic projection of the second connection sub-portion 212 on the substrate base may at least partially overlap with the orthographic projection of the second connection portion 62 on the substrate base. This arrangement may reduce the shading effect of the first connection portion on the display panel and provide the transmittance of the display panel. A size of the orthographic projection of the first connection sub-portion 211 on the substrate base in the second direction Y may be smaller than a size of the orthographic projection of the second conductive portion 22 on the substrate base in the second direction Y, and the orthographic projection of the first connection sub-portion 211 on the substrate base may be located on the orthographic projection of the second connection portion 62 on the substrate base. This arrangement may greatly improve the transmittance of the display panel. In the present exemplary embodiment, a size of the orthographic projection of the second connection sub-portion 212 on the substrate base in the second direction Y is equal to the size of the orthographic projection of the second conductive portion 22 on the substrate base in the second direction Y, so as to reduce a self-resistance of a conductive strip extending in the row direction formed by the second conductive portion 22. It should be understood that in other exemplary embodiments, the size of the orthographic projection of the second connection sub-portion 212 on the substrate base in the second direction Y may also be smaller than the size of the orthographic projection of the second conductive portion 22 on the substrate base in the second direction Y. In addition, in other exemplary embodiments, the first connection sub-portion 211 may not be provided between the two second conductive portions 22 in the adjacent repeating units, and that is, the two second conductive portions 22 in the adjacent repeating units are spaced apart from each other in the first direction X.

As shown in FIGS. 9, 14 and 21, the second active layer may include an active portion 81, the active portion 81 may include a first active portion 811 and a second active portion 812, the first active portion 811 may be configured to define a channel region of the first transistor and the second active portion 812 may be configured to define a channel region of the second transistor T2. The second active layer may be formed of indium gallium zinc oxide. Accordingly, the first transistor T1 and the second transistor T2 may be N-type metal oxide thin film transistors. The orthographic projection of the third gate line 2G1 on the substrate base may cover an orthographic projection of the second active portion 812 on the substrate base, and a partial structure of the third gate line 2G1 may be configured to form a bottom gate of the second transistor. The orthographic projection of the third reset signal line 2Re1 on the substrate base may cover the orthographic projection of the first active portion 811 on the substrate base, and a partial structure of the third reset signal line 2Re1 may be configured to form a bottom gate of the first transistor T1.

As shown in FIGS. 9, 15 and 22, the third conductive layer may include a first reset signal line 3Re1 and a first gate line 3G1. An orthographic projection of the first reset signal line 3Re1 on the substrate base and an orthographic projection of the first gate line 3G1 on the substrate base may extend along the first direction X. The first reset signal line 3Re1 may be used to provide the first reset signal terminal in FIG. 1. The orthographic projection of the first reset signal line 3Re1 on the substrate base may cover the orthographic projection of the first active portion 811 on the substrate base. A partial structure of the first reset signal line 3Re1 may be configured to form a top gate of the first transistor T1. The first reset signal line 3Re1 may be connected to the third reset signal terminal 2Re1 through a via hole located in a wiring area along an edge of the display panel. The first gate line 3G1 may be used to provide the first gate driving signal terminal in FIG. 1. The orthographic projection of the first gate line 3G1 on the substrate base may cover the orthographic projection of the second active portion 812 on the substrate base. A partial structure of the first gate line 3G1 may be configured to form a top gate of the second transistor T2. The first gate line 3G1 may be connected to the third gate line 2G1 through a via hole located in the wiring area along the edge of the display panel. As shown in FIGS. 9 and 22, in the same pixel driving circuit, the orthographic projection of the first conductive portion 11 on the substrate base may be located between the orthographic projection of the first gate line 3G1 on the substrate base and the orthographic projection of the enabling signal line EM on the substrate base, the orthographic projection of the first reset signal line 3Re1 on the substrate base may be located on a side of the orthographic projection of the first gate line 3G1 on the substrate base away from the orthographic projection of the first conductive portion 11 on the substrate base. The orthographic projection of the second gate line G2 on the substrate base may be located between the orthographic projection of the first gate line 3G1 on the substrate base and the orthographic projection of the first reset signal line 3Re1 on the substrate base. The orthographic projection of the second reset signal line Re2 on the substrate base may be located on a side of the orthographic projection of the enabling signal line EM on the substrate base away from the orthographic projection of the first conductive portion 11 on the substrate base. In addition, the display panel may use the third conductive layer as a mask to conduct a conductive treatment on the second active layer, that is, a region covered by the third conductive layer in the second active layer may be formed as a channel region of the transistor, and a region not covered by the third conductive layer may be formed as a conductor structure.

As shown in FIGS. 9, 16, and 23, the fourth conductive layer may include a first bridging portion 41, a second bridging portion 42, a third bridging portion 43, a fourth bridging portion 44, a fifth bridging portion 45, a sixth bridging portion 46, and a second initial signal line Vinit2. The first bridging portion 41 may be connected to the second connection sub-portion 212 through two via holes, and be connected to the eighth active portion 78 in the first pixel driving circuit P1 and the eighth active portion 78 in the second pixel driving circuit P2 through a via hole, respectively, so as to connect the first electrode of the fifth transistor and the second electrode of the capacitor C. The first bridging portion 41 may be arranged in a mirror symmetrical way with a mirror symmetry plane of the first pixel driving circuit P1 and the second pixel driving circuit P2. The second bridging portion 42 may be connected to the first active layer between the sixth active portion 76 and the seventh active portion 77 through a via hole, so as to connect the second electrode of the sixth transistor T6 and the first electrode of the seventh transistor T7. The second bridging portion 42 may be used to connect the first electrode of the light-emitting unit in the display panel. The third bridging portion 43 may be connected to the first active layer between the sixth active portion 76 and the third active portion 73, as well as the second active layer on a side of the second active portion 812 away from the first active portion 811 through a via hole, respectively, so as to connect the second electrode of the second transistor T2, the first electrode of the sixth transistor T6, and the second electrode of the driving transistor T3. The fourth bridging portion 44 may be connected to the second active layer between the first active portion 811 and the second active portion 812 as well as the first conductive portion 11 through a via hole, respectively, so as to connect the first electrode of the second transistor T2 and the gate of the driving transistor. As shown in FIG. 13, an opening 221 is defined on the second conductive portion 22, and an orthographic projection of the via hole connected between the first conductive portion 11 and the fourth bridging portion 44 on the substrate base is located an orthographic projection of the opening 221 on the substrate base, such that the conductive structure in the via hole is insulated from the second conductive portion 22. The fifth bridging portion 45 may be connected to the second active layer on a side of the first active portion 811 away from the second active portion 812 as well as the first initial signal line Vinit1 through a via hole, respectively, so as to connect the second electrode of the first transistor and the first initial signal terminal. The sixth bridging portion 46 may be connected to the first active layer on a side of the fourth active portion 74 away from the third active portion 73 through a via hole, so as to connect the first electrode of the fourth transistor. The second initial signal line Vinit2 may be used to provide the second initial signal terminal in FIG. 1. The second initial signal line Vinit2 may be connected to the first active layer on a side of the seventh active portion 77 away from the sixth active portion 76 through a via hole, so as to connect the second electrode of the seventh transistor and the second initial signal terminal.

As shown in FIGS. 9 and 17, the fifth conductive layer may include a plurality of power lines VDD, a plurality of data lines Da, and a seventh bridging portion 57. Orthographic projections of the power lines VDD on the substrate base and orthographic projections of the data lines DA on the substrate base may extend along the second direction Y. The power line VDD may be used to provide the first power terminal in FIG. 1, and the data line DA may be used to provide the data signal terminal in FIG. 1. As shown in FIG. 9, each column of pixel driving circuit may be correspondingly provided with one power line. The power line VDD in the first pixel driving circuit P1 may be connected to the first bridging portion 41 through a via hole, and the power line VDD in the second pixel driving circuit P2 may be connected to the same first bridging portion 41 through a via hole, so as to connect the first electrode of the fifth transistor and the first power terminal. The data line DA may be connected to the sixth bridging portion 46 through a via hole to connect the first electrode of the fourth transistor and the data signal terminal. It is merely shown a part of the data line Da, and it may be understood that the orthographic projection of the data line DA on the substrate base extends along the second direction Y. The seventh bridging portion 57 may be connected to the second bridging portion 42 through a via hole to connect the first electrode of the seventh transistor, and the seventh bridging portion 57 may be used to connect the first electrode of the light-emitting unit. It should be understood that in other exemplary embodiments, multi-column pixel driving circuits may also be correspondingly provided with one power line. As shown in FIG. 17, the power line VDD may include a first extension portion VDD1, a second extension portion VDD2, and a third extension portion VDD3, and the second extension portion VDD2 is connected between the first extension portion VDD1 and the third extension portion VDD3, A size of an orthographic projection of the second extension portion VDD2 on the substrate base in the first direction X may be larger than a size of an orthographic projection of the first extension portion VDD1 on the substrate base in the first direction X, and a size of the orthographic projection of the second extension portion VDD2 on the substrate base in the first direction X may be larger than a size of an orthographic projection of the third extension portion VDD3 on the substrate base in the first direction X. The orthographic projection of the second extension portion VDD2 on the substrate base may cover the orthographic projection of the first active portion 811 on the substrate base and the orthographic projection of the second active portion 812 on the substrate base. The second extension portion VDD2 may reduce influence of light on the characteristics of the first transistor T1 and the second transistor T2.

It should be noted that, as shown in FIGS. 9 and 23, a black square drawn on a side of the fourth conductive layer away from the substrate base indicates that the fourth conductive layer is connected to a via hole of another layer facing a side of the substrate base; a black square drawn on a side of the fifth conductive layer away from the substrate base indicates that the fifth conductive layer is connected to a via hole of another layer facing a side of the substrate base. The black squares only represent positions of the via holes, and different via holes represented by the black squares at different positions may run through different insulating layers. For example, a via hole connected between the first bridging portion 41 and the second sub connection portion 212 may run through the insulating layer between the second conductive layer and the fourth conductive layer, a via hole connected between the first bridging portion 41 and the eighth active portion 78 may run through the insulating layer between the first active layer and the fourth conductive layer, a via hole connected between the second active layer on the side of the second active portion 812 away from the first active portion 811 and the third bridging portion 43 may run through the insulating layer between the fourth conductive layer and the second active layer; a via hole connected between the fourth bridging portion 44 and the first conductive portion 11 may run through the insulating layer between the fourth conductive layer and the first conductive layer; and a via hole connected between the power line VDD and the first bridging portion 41 may run through the insulating layer between the fourth conductive layer and the fifth conductive layer. In addition, in the following embodiments, the way to draw the via hole and the meaning of the via hole in the drawings are the same as those of the present exemplary embodiment.

Figure 24:
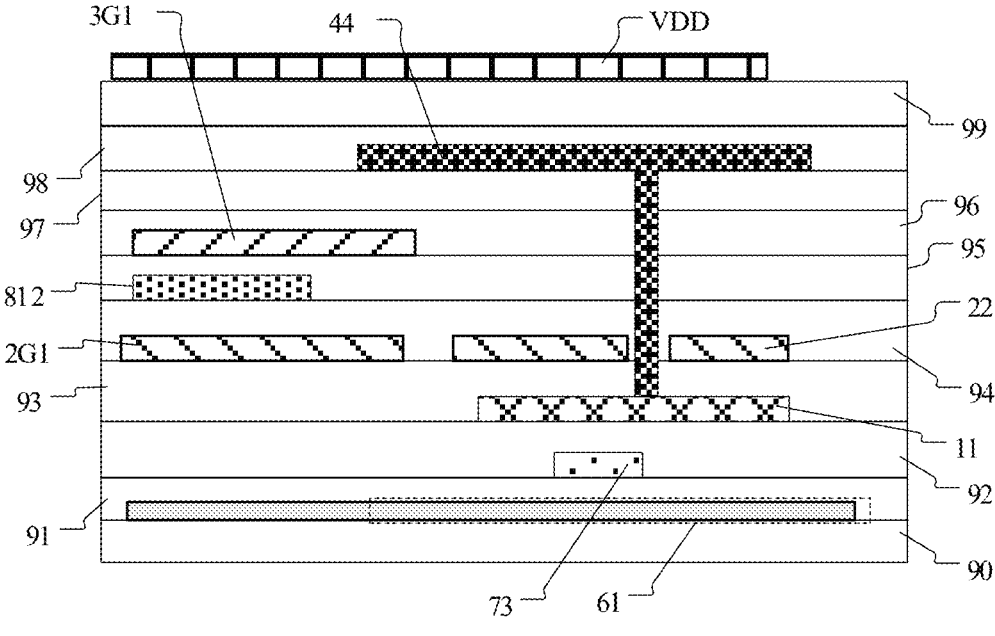
FIG. 24 is a partial sectional view of a display panel of the present disclosure taken along a dotted line AA in FIG. 9.

FIG. 24 is a partial sectional view of a display panel taken along a dotted line AA in FIG. 9. As shown in FIG. 24, the display panel may further include a first insulating layer 91, a second insulating layer 92, a third insulating layer 93, a fourth insulating layer 94, a fifth insulating layer 95, a first dielectric layer 96, a second dielectric layer 97, a passivation layer 98, and a planarization layer 99. The substrate base 90, a light shielding layer, a first insulating layer 91, a first active layer, a second insulating layer 92, a first conductive layer, a third insulating layer 93, the second conductive layer, the fourth insulating layer 94, the second active layer, the fifth insulating layer 95, the third conductive layer, the first dielectric layer 96, the second dielectric layer 97, the fourth conductive layer, the passivation layer 98, the planarization layer 99, and the fifth conductive layer are stacked in sequence. The first insulating layer 91, the second insulating layer 92, the third insulating layer 93, the fourth insulating layer 94, and the fifth insulating layer 95 may be a single-layer structure or a multi-layer structure, and materials of the first insulating layer 91, the second insulating layer 92, the third insulating layer 93, the fourth insulating layer 94, and the fifth insulating layer 95 may be at least one of silicon nitride, silicon oxide, and silicon oxynitride. The first dielectric layer 96, the second dielectric layer 97 and the passivation layer 98 may be silicon nitride layers. Material of the planarization layer 99 may be organic material, such as polyimide (P1), polyethylene terephthalate (PET), polyethylene naphthalate (PEN), silicon-glass bonding structure (SOG) and the like. The substrate base 90 may include a glass substrate base, a barrier layer, and a polyimide layer that are stacked in sequence, and the barrier layer may be an inorganic material. Materials of the first conductive layer, the second conductive layer and the third conductive layer may be one of molybdenum, aluminum, copper, titanium and niobium or alloy, or molybdenum/titanium alloy or lamination and the like. Materials of the fourth conductive layer and the fifth conductive layer may include metal material, such as molybdenum, aluminum, copper, titanium, niobium or alloy, or molybdenum/titanium alloy or lamination, or titanium/aluminum/titanium laminations. In addition, in other exemplary embodiments, it is also only provide a planarization layer between the fourth conductive layer and the fifth conductive layer in the display panel without a passivation layer.

Figure 25:
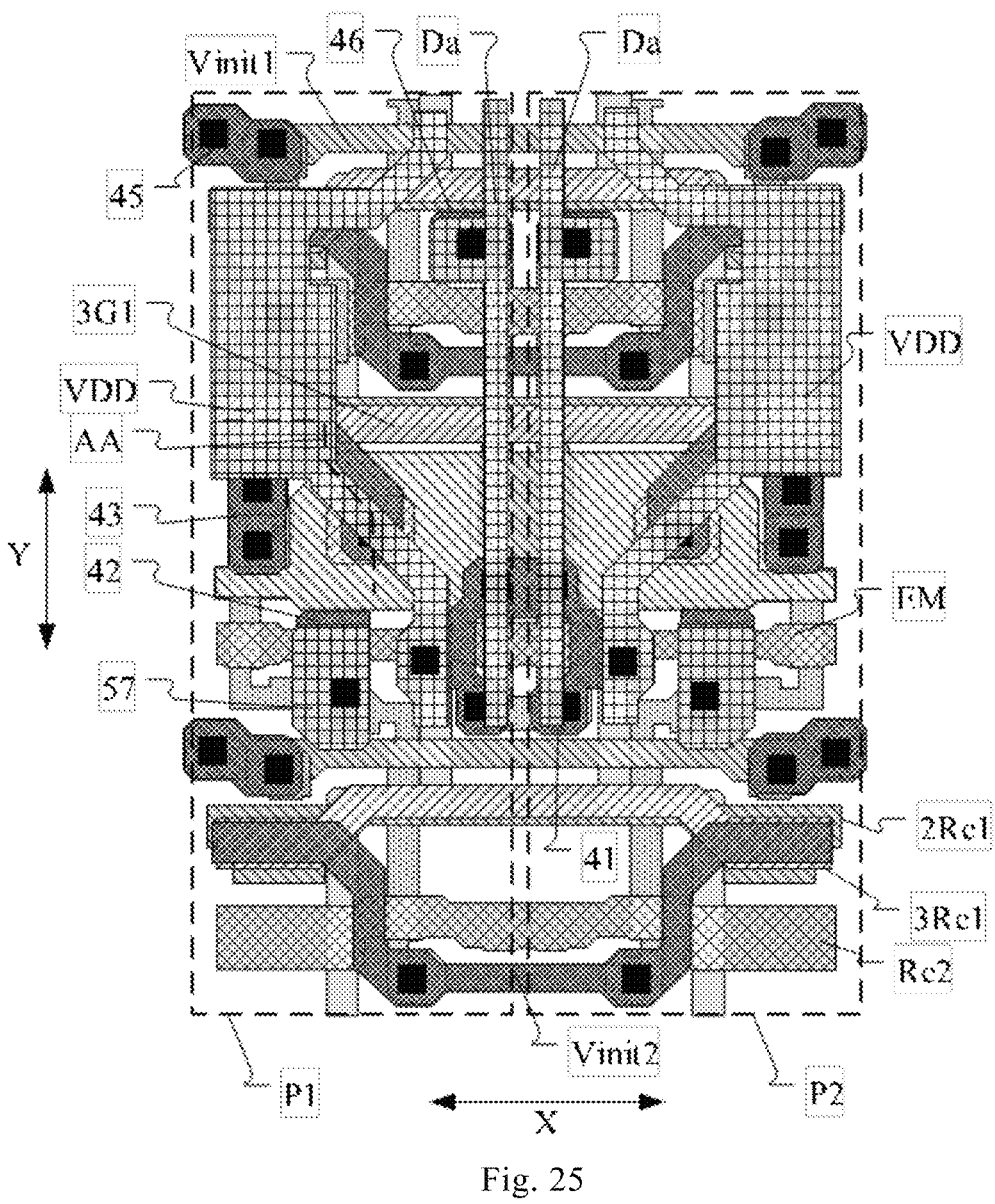
FIG. 25 is a structural layout of yet another exemplary embodiment of a display panel of the present disclosure.

As shown in FIG. 25, a structural layout of yet another exemplary embodiment of a display panel of the present disclosure is shown. The display panel may include a plurality of pixel driving circuits shown in FIG. 1, and the plurality of pixel driving circuits include a first pixel driving circuit P1 and a second pixel driving circuit P2 which are adjacent to each other in the first direction X. The first pixel driving circuit P1 and the second pixel driving circuit P2 may be arranged in a mirror symmetrical way. The display panel may also include a substrate base, a light shielding layer, a first active layer, a first conductive layer, a second conductive layer, a second active layer, a third conductive layer, a fourth conductive layer, and a fifth conductive layer that are stacked in sequence.

The light shielding layer in the display panel shown in FIG. 25 has the same layout structure as the light shielding layer in the display panel shown in FIG. 9. The light shielding layer may include two light shielding portions 61 distributed in the first direction X and a second connection portion 62 connected between the light shielding portions 61. The light shielding layer may be a conductor structure, for example, the light shielding layer may be a light shielding metal layer.

The first active layer in the display panel shown in FIG. 25 has the same layout structure as the first active layer in the display panel shown in FIG. 9. The first active layer may also include a third active portion 73, a fourth active portion 74, a fifth active portion 75, a sixth active portion 76, a seventh active portion 77, an eighth active portion 78, a ninth active portion 79.

The first conductive layer in the display panel shown in FIG. 25 has the same layout structure as the first conductive layer in the display panel shown in FIG. 9. The first conductive layer may also include: a first conductive portion 11, a second gate line G2, an enabling signal line EM, a second reset signal line Re2.

The second conductive layer in the display panel shown in FIG. 25 has the same layout structure as the second conductive layer in the display panel shown in FIG. 9. The second conductive layer may also include: the first initial signal line Vinit1, the third reset signal line 2Re1, the third gate line 2G1, and a plurality of second conductive portions 22.

The second active layer in the display panel shown in FIG. 25 has the same layout structure as the second active layer in the display panel shown in FIG. 9. The second active layer may include an active portion 81, which may include a first active portion 811 and a second active portion 812.

The third conductive layer in the display panel shown in FIG. 25 has the same layout structure as the third conductive layer in the display panel shown in FIG. 9. The third conductive layer may also include a first reset signal line 3Re1 and a first gate line 3G1.

Figures 26, 27:
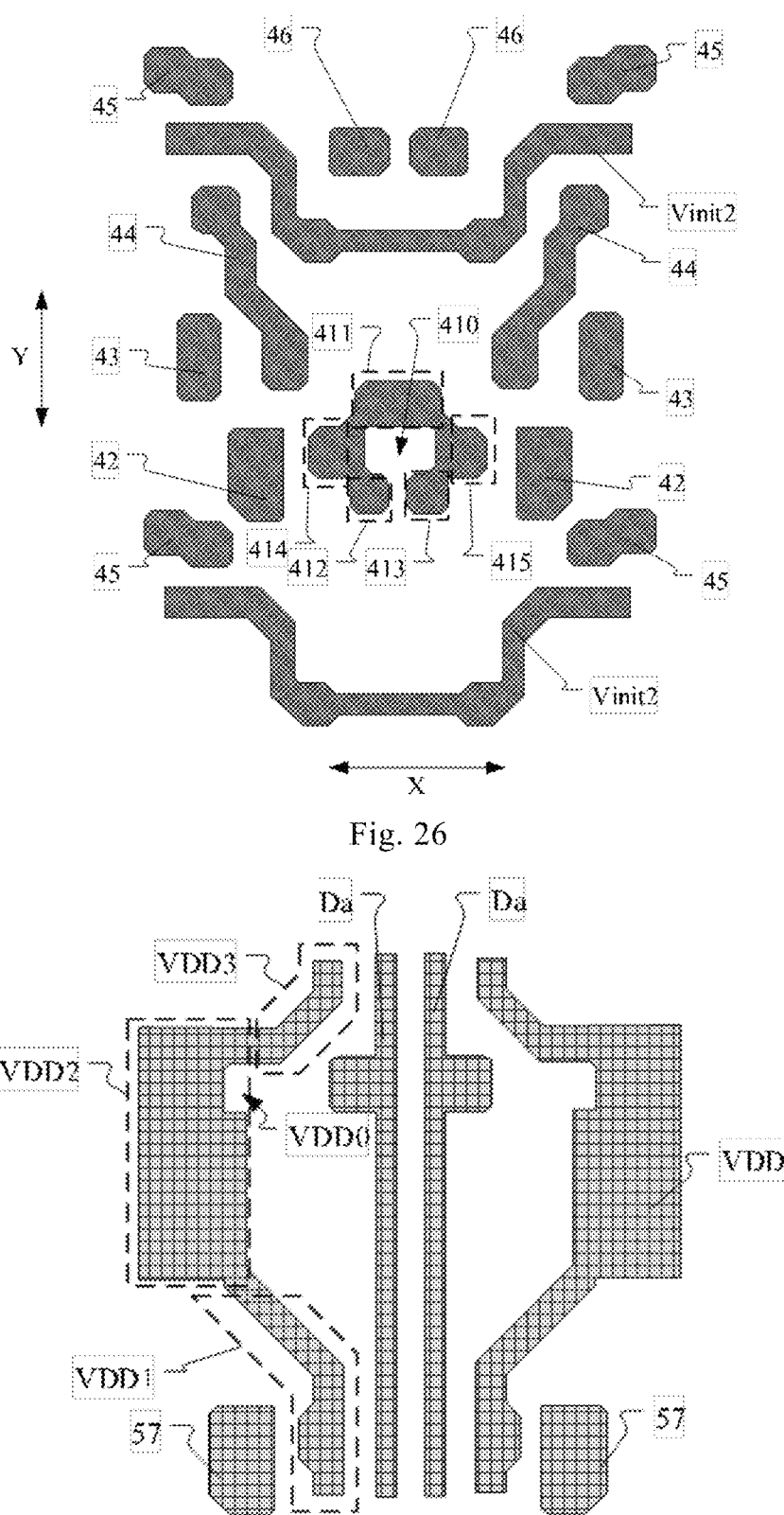
FIG. 26 is a structural layout of a fourth conductive layer in FIG. 25.
FIG. 27 is a structural layout of a fifth conductive layer in FIG. 25.
Figure 28:
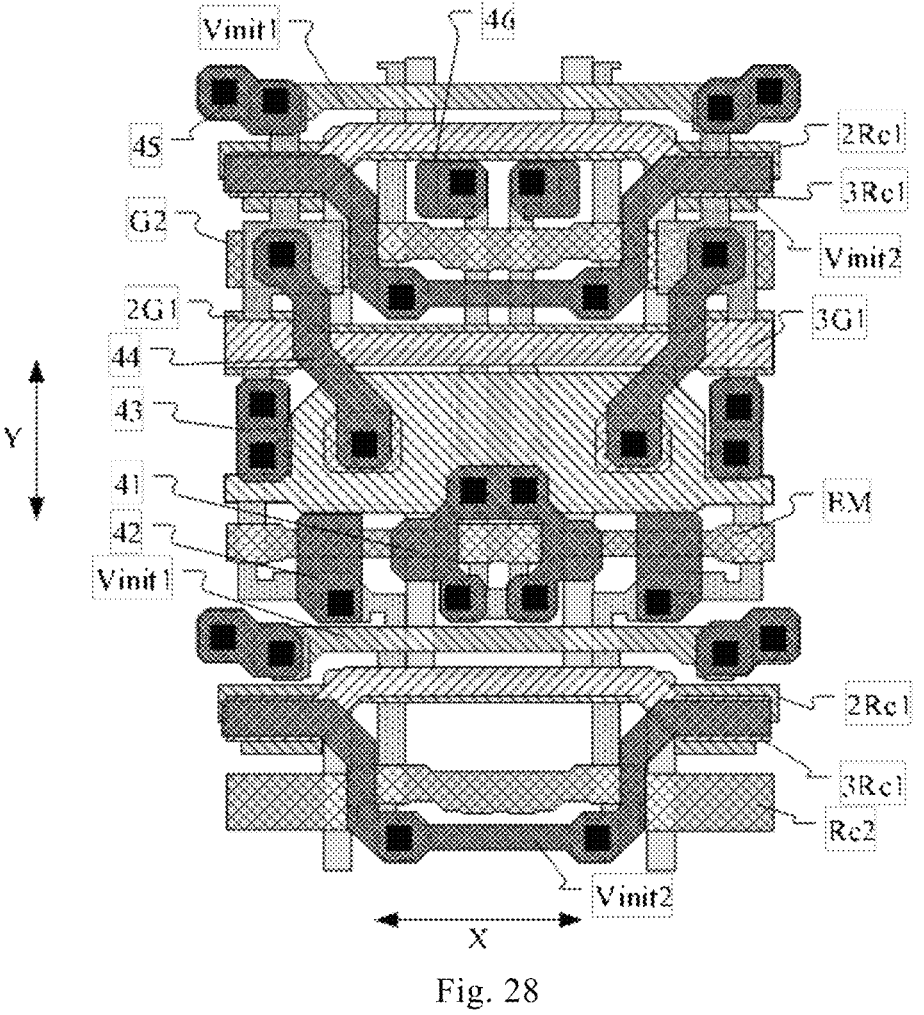
FIG. 28 is a structural layout of a light shielding layer, a first active layer, a first conductive layer, a second conductive layer, a second active layer, a third conductive layer and a fourth conductive layer in FIG. 25.

The display panel shown in FIG. 25 differs from the display panel shown in FIG. 9 merely in the structural layouts of the fourth conductive layer and the fifth conductive layer. As shown in FIGS. 26-28, FIG. 26 is a structural layout of a fourth conductive layer in FIG. 25, FIG. 27 is a structural layout of a fifth conductive layer in FIG. 25, and FIG. 28 is a structural layout of a light shielding layer, a first active layer, a first conductive layer, a second conductive layer, a second active layer, a third conductive layer and a fourth conductive layer in FIG. 25.

As shown in FIGS. 25, 26, and 28, the fourth conductive layer may also include a first bridging portion 41, a second bridging portion 42, a third bridging portion 43, a fourth bridging portion 44, a fifth bridging portion 45, a sixth bridging portion 46, and a second initial signal line Vinit2. The first bridging portion 41 in FIG. 26 has a different layout structure from the first bridging portion 41 in FIG. 16. As shown in FIG. 26, the first bridging portion 41 may be defined with a hollow portion 410, and a region where the hollow portion 410 is located may at least partially form a light transmission region of the display panel. The light transmission region of the display panel may be understood as a region not covered by any structure with light shielding effect, which is a region not covered by the light shielding layer, the first conductive layer, the first active layer, the second conductive layer, the second active layer, the third conductive layer, the fourth conductive layer and the fifth conductive layer. This arrangement may improve the transmittance of the display panel. As shown in FIGS. 25, 26 and 28, an orthographic projection of the hollow portion 410 on the substrate base may also at least partially overlap with the orthographic projection of the enabling signal line EM on the substrate base. This arrangement may also reduce a parasitic capacitor of the enabling signal line EM and improve charging speed of the enabling signal line, thereby improving response speed of the fifth transistor T5 and the sixth transistor T6.

As shown in FIGS. 25, 26, and 28, the first bridging portion 41 may include a first via-hole contact portion 411, a second via-hole contact portion 412, a third via-hole contact portion 413, a fourth via-hole contact portion 414, and a fifth via-hole contact portion 415. The first via-hole contact portion 411 may be connected to the second connection sub-portion 212 through a via hole. The second via-hole contact portion 412 is arranged opposite to the first via-hole contact portion 411 in the second direction Y, and is connected to the eighth active portion 78 in the first pixel driving circuit P1 through a via hole. The third via-hole contact portion 413 is arranged opposite to the first via-hole contact portion 411 in the second direction Y, and is connected to the eighth active portion 78 in the second pixel driving circuit P2 through a via hole. The fourth via-hole contact 414 is connected between the first via-hole contact 411 and the second via-hole contact 412, and is connected to the power line VDD in the first pixel driving circuit P1 through a via hole. The fifth via-hole contact portion 415 is connected between the first via-hole contact portion 411 and the third via-hole contact portion 413, and is connected to the power line VDD in the second pixel driving circuit P2 through a via hole. The fifth via-hole contact portion 415 and the fourth via-hole contact portion 414 are arranged opposite to each other in the first direction X. The first via-hole contact portion 411, the second via-hole contact portion 412, the third via-hole contact portion 413, the fourth via-hole contact portion 414, and the fifth via-hole contact portion 415 may be configured to surround and define the hollow portion 410. Structure A and structure B are arranged opposite to each other in the first direction X, which may be understood as that an orthographic projection of structure A on the substrate base and an orthographic projection of structure B on the substrate base are spaced apart from each other in the first direction X, and a region covered by infinite movement of the orthographic projection of structure A on the substrate base in the first direction X and a region covered by infinite movement of the orthographic projection of structure B on the substrate base in the first direction X are at least partially overlapped. Similarly, structure A and structure B are arranged opposite to each other in the second direction Y, which may be understood as that the orthographic projection of structure A on the substrate base and the orthographic projection of structure B on the substrate base are spaced apart from each other in the second direction Y, and a region covered by infinite movement of the orthographic projection of structure A on the substrate base in the second direction Y and a region covered by infinite movement of the orthographic projection of structure B on the substrate base in the second direction Y are at least partially overlapped.

As shown in FIG. 26, in the first direction X, an orthographic projection of the first via-hole contact portion 411 on the substrate base, an orthographic projection of the second via-hole contact portion 412 on the substrate base, an orthographic projection of the third via-hole contact portion 413 on the substrate base may be located between an orthographic projection of the fourth via-hole contact portion 414 on the substrate base and an orthographic projection of the fifth via-hole contact portion 415 on the substrate base. In the second direction Y, the orthographic projection of the fourth via-hole contact portion 414 on the substrate base and the orthographic projection of the fifth via-hole contact portion 415 on the substrate base may be located between the orthographic projection of the first via-hole contact portion 411 on the substrate base and the orthographic projection of the second via-hole contact portion 412 on the substrate base. In the second direction Y, the orthographic projection of the fourth via-hole contact portion 414 on the substrate base and the orthographic projection of the fifth via-hole contact portion 415 on the substrate base may be located between the orthographic projection of the first via-hole contact portion 411 on the substrate base and the orthographic projection of the third via-hole contact portion 413 on the substrate base. The hollow portion 410 may be a closed opening or a non-closed opening. In the present exemplary embodiment, the hollow portion 410 may be a non-closed opening. As shown in FIG. 26, there may be a certain gap between the second via-hole contact portion 412 and the third via-hole contact portion 413. It should be understood that in other exemplary embodiments, the second via-hole contact portion 412 and the third via-hole contact portion 413 may also be directly connected to define a hollow portion 410 with a closed opening.

As shown in FIGS. 25 and 27, the fifth conductive layer may also include a power line VDD, a data line Da, and a seventh bridging portion 57. The difference of the fifth conductive layer shown in FIG. 27 and the fifth conductive layer shown in FIG. 17 lies in that the power line VDD in FIG. 27 has a different layout structure from the power line VDD in FIG. 17. As shown in FIGS. 25 and 27, in the display panel shown in FIG. 25, a notch VDD0 is defined on the second extension portion VDD2, and at least a partial region where the notch VDD0 is located may form the light transmission region of the display panel. This arrangement may improve the transmittance of the display panel. The notch VDD0 may be defined on a side of the second extension portion VDD2 facing the fourth active portion 74, and an orthographic projection of the notch VDD0 on the substrate base may be located between the orthographic projection of the second gate line G2 on the substrate base and the orthographic projection of the first reset signal line Vinit1 on the substrate base. It should be understood that in other exemplary embodiments, the notch VDD0 may also be defined at other positions of the second extension portion VDD2. In addition, the display panel may also improve the transmittance of the display panel by defining a hollow structure on the second extension portion VDD2. In the present exemplary embodiment, the power line VDD may be formed as a grid structure with the second conductive portion transversely connected in the first direction X, such that the power line on the display panel has a relatively small self-resistance. On this basis, the present exemplary embodiment may also appropriately reduce a width of the power line VDD to increase the transmittance of the display panel. For example, the present exemplary embodiment may appropriately reduce a size of the second extension portion VDD2 in the first direction X. In the present exemplary embodiment, a size of the orthographic projection of the second extension portion VDD2 on the substrate base in the first direction X is L1, and a size of the orthographic projection of the second extension portion VDD2 on the substrate base in the second direction Y is L2, and L1/L2 may be less than or equal to ½. For example, L1/L2 may be ½, ⅓/, ¼, and the like.

As shown in FIG. 25, a partial sectional view taken along a dotted line AA in FIG. 25 may be the same as that shown in FIG. 24.

Figure 29:
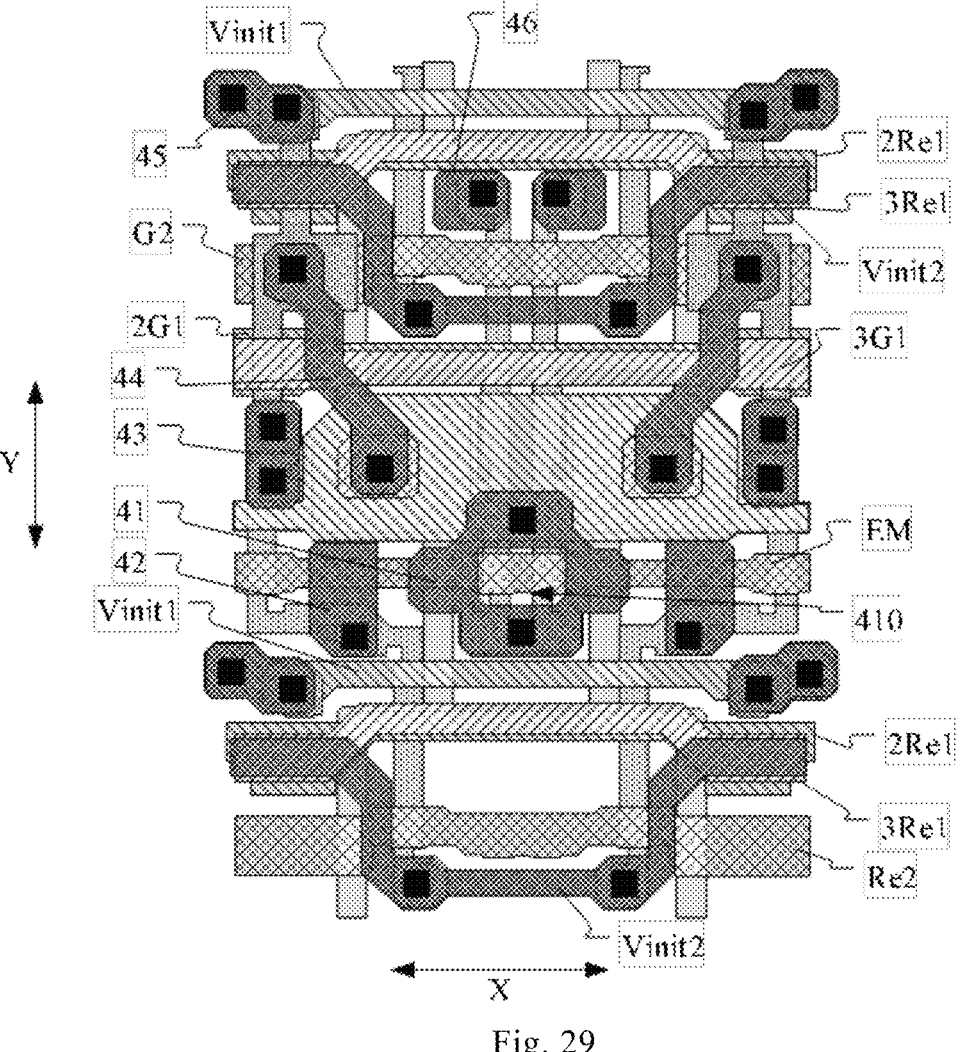
FIG. 29 is a structural layout of a light shielding layer, a first active layer, a first conductive layer, a second conductive layer, a second active layer, a third conductive layer and a fourth conductive layer in another exemplary embodiment of a display panel of the present disclosure.

As shown in FIG. 29, a structural layout of a light shielding layer, a first active layer, a first conductive layer, a second conductive layer, a second active layer, a third conductive layer and a fourth conductive layer in another exemplary embodiment of a display panel of the present disclosure is shown. Difference between the display panel shown in FIG. 29 and that shown in FIG. 28 lies in that the hollow portion 410 on the first bridging portion 41 may be closed graphic. Two via holes of the first bridging portion 41 connecting the second connection sub-portion 212 may be combined as one via hole, and the combined via hole may be arranged in a mirror symmetrical way with a mirror symmetry plane of the first pixel driving circuit and the second pixel driving circuit. The two via holes, respectively connecting the eighth active portion in the first pixel driving circuit and the eighth active portion in the second pixel driving circuit, of the first bridging portion 41 may be combined as one via hole, and the combined via hole may be connected to the eighth active portion in the first pixel driving circuit and the eighth active portion in the second pixel driving circuit by connecting the ninth active portion 79, and the combined via hole may be arranged in a mirror symmetrical way with the mirror symmetry plane of the first pixel driving circuit and the second pixel driving circuit.

Figures 30, 31:
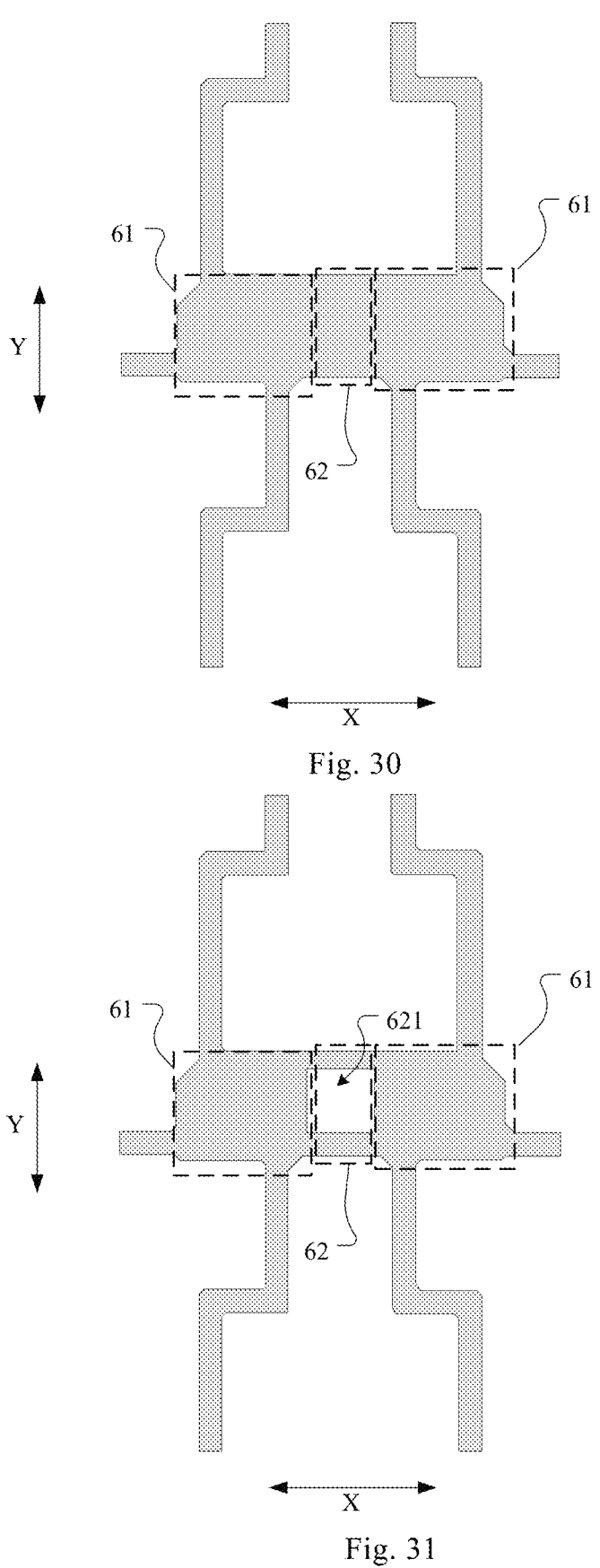
FIG. 30 is a structural layout of a light shielding layer in another exemplary embodiment of a display panel of the present disclosure.
FIG. 31 is a structural layout of a light shielding layer in another exemplary embodiment of a display panel of the present disclosure.

As shown in FIG. 30, a structural layout of a light shielding layer in another exemplary embodiment of a display panel of the present disclosure is shown. In a same repeating unit, a size of the orthographic projection of the second connection portion 62 connected between the two adjacent light shielding portions 61 in the first direction X on the substrate base in the second direction Y may be L1, a size of the orthographic projection of the light shielding portion 61 on the substrate base in the second direction Y may be L2, L1 may be greater than or equal to 80%*L2 and less than or equal to L2. For example, L1 may be equal to 80%*L2, 90%*L2, L2, and the like. This arrangement may reduce the voltage drop of the light shielding layer.

As shown in FIG. 31, a structural layout of a light shielding layer in another exemplary embodiment of a display panel of the present disclosure is shown. Difference between FIG. 31 and FIG. 30 lies in that a hollow portion 621 is defined on the second connection portion 62, and the hollow portion 621 may be one or more than one. This arrangement may reduce the influence of the light shielding layer on the transmittance of the display panel.

In addition, it should be noted that proportion of the drawings in the present disclosure may be used as a reference in the actual process, but is not limited to this. For example, ratio of a width to a length of a channel, a thickness and spacing of each film layer, and a width and spacing of each signal line may be adjusted according to the actual needs. Number of pixels in the display substrate base and number of sub pixels in each pixel are not limited to the number shown in the drawings, and the drawings described in the present disclosure are only structural schematic diagrams.

The present exemplary embodiment also provides a display apparatus including the above-mentioned display panel. The display apparatus may be a display apparatus such as a mobile phone, a tablet computer, a television and the like.

Other embodiments of the present disclosure will be readily conceivable to those skilled in the art upon consideration of the specification and practice of what is disclosed herein. This application is intended to cover any variations, uses, or adaptations of the present disclosure that follow the general principles of the present disclosure and include common knowledge or techniques in the technical field not disclosed by the present disclosure. The specification and examples are to be regarded as exemplary only, with the true scope and spirit of the disclosure being indicated by the claims.

It is to be understood that the present disclosure is not limited to the precise structures described above and illustrated in the accompanying drawings, and that various modifications and changes may be made without departing from the scope thereof. The scope of the present disclosure is limited only by the appended claims.

What is claimed is:

1. A display panel, comprising a plurality of pixel driving circuits distributed in an array along a first direction and a second direction, wherein the first direction and the second direction intersect, the pixel driving circuit comprises a driving transistor and a capacitor, a first electrode of the capacitor is connected to a gate of the driving transistor, and a second electrode of the capacitor is connected to a power line, and the display panel further comprises:

a substrate base;

a second conductive layer located on a side of the substrate base, wherein the second conductive layer comprises:

a plurality of second conductive portions, wherein the second conductive portion is configured to form the second electrode of the capacitor in the pixel driving circuit corresponding to the second conductive portion;

a fifth conductive layer located on a side of the second conductive layer away from the substrate base, wherein the fifth conductive layer comprises:

a plurality of the power lines, wherein at least one of the plurality of second conductive portions being electrically connected to at least one of the plurality of the power lines;

wherein the display panel comprises at least two adjacent pixel driving circuits, and the two adjacent pixel driving circuits comprise a first pixel driving circuit and a second pixel driving circuit distributed along the first direction;

the second conductive layer further comprise:

a second connection sub-portion connected between two second conductive portions in the first pixel driving circuit and the second pixel driving circuit respectively in the first direction;

wherein the pixel driving circuit further comprises a fifth transistor, wherein a first electrode of the fifth transistor is connected to the power line, and a second electrode of the fifth transistor is connected to a first electrode of the driving transistor;

the first active layer comprises:

a fifth active portion configured to define a channel region of the fifth transistor;

an eighth active portion connected to a side of the fifth active portion away from the third active portion;

the display panel further comprises:

a first conductive layer located between the first active layer and the second conductive layer, wherein the first conductive layer comprises:

an enabling signal line, an orthographic projection of the enabling signal line on the substrate base extending along the first direction and covering an orthographic projection of the fifth active portion on the substrate base, and a partial structure of the enabling signal line being configured to form a gate of the fifth transistor;

a fourth conductive layer located between the second conductive layer and the fifth conductive layer, wherein the fourth conductive layer comprises:

a first bridging portion connected to the eighth active portion in the first pixel driving circuit and the eighth active portion in the second pixel driving circuit through a via hole, respectively, and the first bridging portion being connected to the power line through a via hole.

2. The display panel according to claim 1, wherein an orthographic projection of the first bridging portion on the substrate base and the orthographic projection of the enabling signal line on the substrate base have an overlapping region, wherein a size of the overlapping region along the first direction is less than a size of the first bridging portion along the first direction.

3. The display panel according to claim 1, wherein a hollow portion is defined on the first bridging portion.

4. The display panel according to claim 1, wherein the first bridging portion is connected to the eighth active portion through one via hole.

5. The display panel according to claim 1, wherein the first bridging portion comprises a third via-hole contact portion connected to the power line through a via hole and a fourth via-hole contact portion connected to the power line through a via hole; and orthographic projections of the third via-hole contact portion and the fourth via-hole contact portion on the substrate base are at least partially overlapped with and the orthographic projection of the enabling signal line on the substrate base.

6. The display panel according to claim 1, further comprising:

a third conductive layer located on a side of the second conductive layer away from the substrate base, wherein the third conductive layer comprises a first gate line;

wherein the second conductive layer comprises a third gate line; the pixel driving circuit further comprises a second transistor;

wherein a partial structure of the first gate line is configured to form a top gate of the second transistor and a partial structure of the third gate line is configured to form a bottom gate of the second transistor.

7. The display panel according to claim 6, wherein an orthographic projection of the first bridging portion on the substrate base does not overlap with orthographic projections of the first gate line and the third gate line on the substrate base.

8. The display panel according to claim 1, further comprising:

a light shielding layer located between the substrate base and the first active layer, wherein the light shielding layer comprises:

a plurality of light shielding portions being arranged in one-to-one correspondence with the plurality of the pixel driving circuits, and a plurality of longitudinal connection portions extending longitudinally from the plurality of light shielding portions;

wherein an orthographic projection of the first bridging portion on the substrate base is at least partially overlapped with orthographic projections of the plurality of longitudinal connection portions on the substrate base.

9. The display panel according to claim 1, wherein the display panel further comprises:

a first active layer located between the substrate base and the second conductive layer, wherein the first active layer comprises:

a plurality of third active portions arranged in one-to-one correspondence with the plurality of the pixel driving circuits, the third active portion being configured to define a channel region of the driving transistor in the pixel driving circuit corresponding to the third active portion;

a light shielding layer located between the substrate base and the first active layer, wherein the light shielding layer comprises:

a plurality of light shielding portions being arranged in one-to-one correspondence with the plurality of the pixel driving circuits, an orthographic projection of the light shielding portion on the substrate base covering an orthographic projection of the third active portion on the substrate base in the pixel driving circuit corresponding to the light shielding portion.

10. The display panel according to claim 1, wherein the pixel driving circuit further comprises a first transistor and a second transistor, a first electrode of the first transistor is connected to the gate of the driving transistor, a second electrode of the first transistor is connected to a first initial signal line, and a first electrode of the second transistor is connected to the gate of the driving transistor, a second electrode of the second transistor is connected to a second electrode of the driving transistor, and the display panel further comprises:

a second active layer located between the second conductive layer and the fifth conductive layer, wherein the second active layer comprises:

a first active portion configured to define a channel region of the first transistor;

a second active portion connected to the first active portion and configured to define a channel region of the second transistor;

the power line comprises a second extension portion;

an orthographic projection of the second extension portion on the substrate base covering an orthographic projection of the first active portion on the substrate base and an orthographic projection of the second active portion on the substrate base.

11. The display panel according to claim 10, wherein the power line further comprises: a first extension portion and a third extension portion, and the second extension portion is connected between the first extension portion and the third extension portion;

a size of the orthographic projection of the second extension portion on the substrate base in the first direction is larger than a size of an orthographic projection of the first extension portion on the substrate base in the first direction, and the size of the orthographic projection of the second extension portion on the substrate base in the first direction is larger than a size of an orthographic projection of the third extension portion on the substrate base in the first direction;

the size of the orthographic projection of the second extension portion on the substrate base in the first direction is L1, and the size of the orthographic projection of the second extension portion on the substrate base in the second direction is L2, wherein L1/L2 is less than or equal to ½.

12. The display panel according to claim 10, wherein a notch or a hollow structure is defined on the second extension portion, the pixel driving circuit further comprises a fourth transistor, a first electrode of the fourth transistor is connected to a data line, a second electrode of the fourth transistor is connected to a first electrode of the driving transistor, and the display panel further comprises:

a first active layer located between the substrate base and the second conductive layer, the first active layer comprising a fourth active portion configured to define a channel region of the fourth transistor;

a first conductive layer located between the first active layer and the second conductive layer, wherein the first conductive layer comprises a second gate line, an orthographic projection of the second gate line on the substrate base covers an orthographic projection of the fourth active portion on the substrate base, and extends along the first direction, a partial structure of the second gate line is configured to form a gate of the fourth transistor;

a third conductive layer located between the second active layer and the fifth conductive layer, wherein the third conductive layer comprises a first reset signal line, an orthographic projection of the first reset signal line on the substrate base covers the orthographic projection of the first active portion on the substrate base, and a partial structure of the first reset signal line is configured to form a gate of the first transistor;

wherein the notch is defined on a side of the second extension portion facing the fourth active portion, and an orthographic projection of the notch on the substrate base is located between the orthographic projection of the second gate line on the substrate base and the orthographic projection of the first reset signal line on the substrate base.

13. The display panel according to claim 3, wherein an orthographic projection of the hollow portion on the substrate base at least partially overlaps with the orthographic projection of the enabling signal line on the substrate base.

14. The display panel according to claim 3, wherein the second direction is a column direction, and each column of the pixel driving circuit is correspondingly provided with one power line, and the power line in the first pixel driving circuit and the power line in the second pixel driving circuit are connected to the first bridging portion through a via hole, respectively;

the first bridging portion comprises:

a first via-hole contact portion;

a second via-hole contact portion arranged opposite to the first via-hole contact portion in the second direction, and connected to the eighth active portion in the first pixel driving circuit through a via hole;

a third via-hole contact portion arranged opposite to the first via-hole contact portion in the second direction, and connected to the eighth active portion in the second pixel driving circuit through a via hole;

a fourth via-hole contact portion connected between the first via-hole contact portion and the second via-hole contact portion, and connected to the power line in the first pixel driving circuit through a via hole;

a fifth via-hole contact portion connected between the first via-hole contact portion and the third via-hole contact portion, and connected to the power line in the second pixel driving circuit through a via hole, and the fifth via-hole contact portion and the fourth via-hole contact portion being arranged opposite to each other in the first direction;

wherein the first via-hole contact portion, the second via-hole contact portion, the third via-hole contact portion, the fourth via-hole contact portion and the fifth via-hole contact portion are configured to surround and define the hollow portion.

15. The display panel according to claim 1, wherein the first bridging portion is arranged in a mirror symmetrical way with a mirror symmetry plane of the first pixel driving circuit and the second pixel driving circuit.

16. The display panel according to claim 1, wherein the pixel driving circuit further comprises a fourth transistor, a sixth transistor and a seventh transistor, a first electrode of the fourth transistor is connected to a data line, a second electrode of the fourth transistor is connected to a first electrode of the driving transistor, and a first electrode of the sixth transistor is connected to a second electrode of the driving transistor, a first electrode of the seventh transistor is connected to a second electrode of the sixth transistor, and a second electrode of the seventh transistor is connected to a second initial signal line;

the display panel further comprises:

a first active layer located between the substrate base and the second conductive layer, wherein the first active layer comprises:

a third active portion configured to define a channel region of the driving transistor;

a fourth active portion connected to a side of the third active portion, and configured to define a channel region of the fourth transistor;

a sixth active portion connected to a side of the third active portion away from the fourth active portion and configured to define a channel region of the sixth transistor;

a seventh active portion connected to a side of the sixth active portion away from the third active portion and configured to define a channel region of the seventh transistor;

a first conductive layer located between the first active layer and the second conductive layer, wherein the first conductive layer comprises:

a second gate line, an orthographic projection of the second gate line on the substrate base extending along the first direction and covering an orthographic projection of the fourth active portion on the substrate base, and a partial structure of the second gate line being configured to form a gate of the fourth transistor;

an enabling signal line, an orthographic projection of the enabling signal line on the substrate base extending along the first direction and covering an orthographic projection of the sixth active portion on the substrate base, and a partial structure of the enabling signal line being configured to form a gate of the sixth transistor;

a second reset signal line, an orthographic projection of the second reset signal line on the substrate base extending along the first direction and covering an orthographic projection of the seventh active portion on the substrate base, and a partial structure of the second reset signal line being configured to form a gate of the seventh transistor;

a first conductive portion, an orthographic projection of the first conductive portion on the substrate base covering an orthographic projection of the third active portion on the substrate base, and the first conductive portion being configured to form the gate of the driving transistor and the second electrode of the capacitor;

wherein in a same pixel driving circuit, the orthographic projection of the first conductive portion on the substrate base is located between the orthographic projection of the second gate line on the substrate base and the orthographic projection of the enabling signal line on the substrate base;

the orthographic projection of the second reset signal line on the substrate base is located on a side of the orthographic projection of the enabling signal line on the substrate base away from the orthographic projection of the first conductive portion on the substrate base.

17. The display panel according to claim 16, wherein the first direction is a row direction, and the second gate line in the pixel driving circuit of a row is reused as the second reset signal line in the pixel driving circuit of a previous row.

18. The display panel according to claim 16, wherein the pixel driving circuit further comprises a first transistor and a second transistor, a first electrode of the first transistor is connected to the gate of the driving transistor, a second electrode of the first transistor is connected to a first initial signal line, and a first electrode of the second transistor is connected to the gate of the driving transistor, a second electrode of the second transistor is connected to the second electrode of the driving transistor, and the display panel further comprises:

a second active layer located between the second conductive layer and the fifth conductive layer, wherein the second active layer comprises:

a first active portion configured to define a channel region of the first transistor;

a second active portion connected to the first active portion and configured to define a channel region of the second transistor;

a third conductive layer located between the second active layer and the fifth conductive layer, wherein the third conductive layer comprises:

a first reset signal line, an orthographic projection of the first reset signal line on the substrate base covering an orthographic projection of the first active portion on the substrate base, and a partial structure of the first reset signal line being configured to form a top gate of the first transistor;

a first gate line, an orthographic projection of the first gate line on the substrate base covering an orthographic projection of the second active portion on the substrate base, and a partial structure of the first gate line being configured to form a top gate of the second transistor;

wherein in the same pixel driving circuit, the orthographic projection of the first gate line on the substrate base is located between the orthographic projection of the first conductive portion on the substrate base and the orthographic projection of the second gate line on the substrate base, the orthographic projection of the first reset signal line on the substrate base is located on a side of the orthographic projection of the second gate line on the substrate base away from the orthographic projection of the first conductive portion on the substrate base.

19. The display panel according to claim 18, wherein the second conductive layer further comprises:

the first initial signal line, an orthographic projection of the first initial signal line on the substrate base being located on a side of the orthographic projection of the first reset signal line on the substrate base away from the orthographic projection of the first conductive portion on the substrate base;

a third reset signal line connected to the first reset signal line through a via hole, an orthographic projection of the third reset signal line on the substrate base covering the orthographic projection of the first active portion on the substrate base, and a partial structure of the third reset signal line being configured to form a bottom gate of the first transistor;

a third gate line, an orthographic projection of the third gate line on the substrate base covering the orthographic projection of the second active portion on the substrate base, and a partial structure of the third gate line is configured to form a bottom gate of the second transistor.

20. A display apparatus comprising a display panel, wherein the display panel comprises a plurality of pixel driving circuits distributed in an array along a first direction and a second direction, wherein the first direction and the second direction intersect, the pixel driving circuit comprises a driving transistor and a capacitor, a first electrode of the capacitor is connected to a gate of the driving transistor, and a second electrode of the capacitor is connected to a power line, and the display panel further comprises:

a substrate base;

a second conductive layer located on a side of the substrate base, wherein the second conductive layer comprises:

a plurality of second conductive portions, wherein the second conductive portion is configured to form the second electrode of the capacitor in the pixel driving circuit corresponding to the second conductive portion;

a fifth conductive layer located on a side of the second conductive layer away from the substrate base, wherein the fifth conductive layer comprises:

a plurality of the power lines, wherein at least one of the plurality of second conductive portions being electrically connected to at least one of the plurality of the power lines;

wherein the display panel comprises at least two adjacent pixel driving circuits, and the two adjacent pixel driving circuits comprise a first pixel driving circuit and a second pixel driving circuit distributed along the first direction;

the second conductive layer further comprise:

a second connection sub-portion connected between two second conductive portions in the first pixel driving circuit and the second pixel driving circuit respectively in the first direction;

wherein the pixel driving circuit further comprises a fifth transistor, wherein a first electrode of the fifth transistor is connected to the power line, and a second electrode of the fifth transistor is connected to a first electrode of the driving transistor;

the first active layer comprises:

a fifth active portion configured to define a channel region of the fifth transistor;

an eighth active portion connected to a side of the fifth active portion away from the third active portion;

the display panel further comprises:

a first conductive layer located between the first active layer and the second conductive layer, wherein the first conductive layer comprises:

an enabling signal line, an orthographic projection of the enabling signal line on the substrate base extending along the first direction and covering an orthographic projection of the fifth active portion on the substrate base, and a partial structure of the enabling signal line being configured to form a gate of the fifth transistor;

a fourth conductive layer located between the second conductive layer and the fifth conductive layer, wherein the fourth conductive layer comprises:

a first bridging portion connected to the eighth active portion in the first pixel driving circuit and the eighth active portion in the second pixel driving circuit through a via hole, respectively, and the first bridging portion being connected to the power line through a via hole.

* * * * *